United States Patent [19]

Yoshii et al.

[11] Patent Number: 6,087,725
[45] Date of Patent: Jul. 11, 2000

[54] LOW BARRIER OHMIC CONTACT FOR SEMICONDUCTOR LIGHT EMITTING DEVICE

[75] Inventors: Shigeo Yoshii, Kyoto; Yoichi Sasai, Osaka; Satoshi Kamiyama, Hyogo; Tohru Saitoh; Takashi Nishikawa, both of Osaka; Ryoko Miyanaga, Nara, all of Japan

[73] Assignee: Matsushita Electric Industrial Co., Ltd., Osaka, Japan

[21] Appl. No.: 09/161,498

[22] Filed: Sep. 28, 1998

[30] Foreign Application Priority Data

Sep. 29, 1997 [JP] Japan .................................. 9-263142

[51] Int. Cl.[7] .................................................. H01L 33/00
[52] U.S. Cl. .................... 257/744; 257/190; 257/191; 257/78; 257/96; 257/97; 257/103; 257/201
[58] Field of Search ............................... 257/96–97, 103, 257/201, 190–191, 78, 614, 744

[56] References Cited

U.S. PATENT DOCUMENTS

| | | | |
|---|---|---|---|
| 4,992,837 | 2/1991 | Sakai et al. | 257/13 |
| 5,274,269 | 12/1993 | Depuydt et al. | 257/744 |
| 5,293,074 | 3/1994 | Taskar et al. | 257/744 |
| 5,373,175 | 12/1994 | Ozawa et al. | 257/99 |
| 5,396,103 | 3/1995 | Oiu et al. | 257/744 |
| 5,422,902 | 6/1995 | Mensz | 372/43 |
| 5,585,649 | 12/1996 | Ishikawa et al. | 257/94 |
| 5,610,413 | 3/1997 | Fan et al. | 257/97 |
| 5,644,165 | 7/1997 | Goto | 257/744 |
| 5,732,099 | 3/1998 | Kawasumi et al. | 372/48 |
| 5,767,534 | 6/1998 | Chien et al. | 257/91 |
| 5,767,536 | 6/1998 | Murakami et al. | 257/99 |
| 5,818,072 | 10/1998 | Schetzina | 257/78 |
| 5,828,086 | 10/1998 | Ishibashi et al. | 257/94 |
| 5,949,093 | 9/1999 | Tamamura | 257/94 |

FOREIGN PATENT DOCUMENTS 9-92930  4/1997  Japan .

OTHER PUBLICATIONS

P. H. Hollowayk et al., "Interfacial Reactions in the Formation of Ohmic Contacts to Wide Bandgap Semiconductors," Applied Surface Science, 117/118, 1997, pp. 362–372.

M.A. Haase et al., "Blue–green laser diodes", Appl. Phys. Lett. 59 (11), pp. 1272–1274, Sep. 9, 1991.

Y. Fan et al., "Electrical properties of blue/green diode lasers", J. Vac. Sci. Technol. B 12 (4), pp. 2480–2483, Jul./Aug. 1994.

S. Taniguchi et al., "100h II–VI blue–green laser diode", Electronics Letters, vol. 32, No. 6, pp. 552–553, Mar. 14, 1996.

J. Nurnberger et al., "Optimization of p–contacts on ZnSe diodes", Appl. Phys. Lett. 70 (10) pp. 1281–1283, Mar. 10, 1997.

P.M. Mensz. "BeTe/ZnSe graded band gap ohmic contacts to p–ZnSe", Appl. Phys. Lett. 64 (16), pp. 2148–2150, Apr. 18, 1994.

*Primary Examiner*—John Guay
*Attorney, Agent, or Firm*—Eric J. Robinson; Nixon Peabody LLP

[57] ABSTRACT

On a substrate of n-type GaAs, an n-type cladding layer of n-type $Zn_{0.9}Mg_{0.1}S_{0.13}Se_{0.87}$, an n-type light guiding layer of n-type $ZnS_{0.06}Se_{0.94}$, an active layer of ZnCdSe and a p-type light guiding layer of p-type $ZnS_{0.06}Se_{0.94}$ are successively formed. On the p-type light guiding layer, a p-type contact structure is formed. The p-type contact structure includes a first layer of p-type $ZnS_{0.31}Se_{0.54}Te_{0.15}$, a second layer of $ZnS_{0.47}Se_{0.28}Te_{0.25}$, a third layer of p-type $ZnS_{0.65}Te_{0.35}$, a fourth layer of p-type $ZnS_{0.5}Te_{0.5}$ and a fifth layer of p-type ZnTe.

15 Claims, 16 Drawing Sheets

LOW BARRIER OHMIC CONTACT FOR SEMICONDUCTOR LIGHT EMITTING DEVICE

BACKGROUND OF THE INVENTION

The present invention relates to a semiconductor device, a semiconductor light emitting device and a method of manufacturing a semiconductor, and more particularly, it relates to a light emitting diode and a laser diode including a group II-VI compound semiconductor and a method of manufacturing a semiconductor used in such a semiconductor device.

A group II-VI compound semiconductor is regarded as a promising material for realizing an optical device dealing with short wavelength light. An initial semiconductor laser diode using a group II-VI compound semiconductor includes a metal electrode formed by directly evaporating a metal on p-type ZnSe (Appl. Phys. Lett. 59, 1991, p. 1272). However, this metal electrode has a large Schottky barrier between the metal included in the metal electrode and p-type ZnSe, and hence, the operating voltage of the resultant laser diode is disadvantageously high.

In order to overcome this disadvantage, a pseudo-graded superlattice structure including ZnSe and ZnTe, in which thin films of p-type ZnSe and p-type ZnTe are alternately stacked between the p-type ZnSe and the metal electrode so as to vary the average composition, is used as a contact layer. Thus, the operating voltage can be effectively decreased when a structure as designed is realized (for example, J. Vac. Sci. Technol. B 12(4). Jul/Aug 1994, pp. 2480–2483).

However, although a conventional laser device having the longest lifetime includes the aforementioned superlattice structure as a contact layer, its operating voltage is as high as 11 V (Electronics Letters Mar. 14, 1996, Vol. 32, pp. 552–553). This fact reveals that it is difficult to form a superlattice contact layer in an ideal structure as designed. When continuously operated at room temperature, even this laser device with the longest lifetime is broken in at most approximately 100 hours. The main cause of the breakdown seems to be low reproducibility of the contact layer having the superlattice structure.

The pseudo-graded superlattice structure includes plural stacked layers formed by repeating epitaxial growth of a short period of time of ZnSe and ZnTe, which have lattice constants different from each other by 8%. Accordingly, highly accurate epitaxial growth technique is required for attaining a structure as designed, and the work requires high skill. Also, the characteristic of a resultant contact layer is very sensitive to variation in the thickness of respective layers and a concentration of nitrogen used in p-type doping. In particular, the reproducibility of the current-voltage characteristic is low, and it is difficult to obtain a contact layer with a sufficiently low contact voltage.

Moreover, since there is a large lattice mismatch between ZnSe and ZnTe, the quality of the resultant crystal is poor. Therefore, not only a large number of crystal defects are caused during the growth but also strain remains within the contact layer after the growth. Accordingly, the device has poor stability against a heat treatment and current injection, resulting in easily degrading in the characteristic thereof.

Also, the contact layer has another problem that the resistance of a ZnSe layer is increased owing to diffusion of nitrogen. Since a ZnTe layer incorporates a much larger amount of nitrogen than a ZnSe layer during the growth, the nitrogen included in the ZnTe layer is diffused into the ZnSe layer through temperature increase or the like during or after the growth. As a result, the diffused nitrogen compensates or deactivates an acceptor of the ZnSe layer, and hence, the resistance of the ZnSe layer can be easily increased.

As described so far, the pseudo-graded superlattice structure has a large number of problems in difficulty in the manufacture, low reproducibility and instability in the operation.

An attempt has been made to provide an alloyed crystal layer of ZnSTe between a ZnTe layer and a ZnSe layer as a contact layer replaceable with the pseudo-graded superlattice structure (Appl. Phys. Lett. 70(10), 1997, pp. 1281–1283). However, in this structure, a large potential barrier is formed on an interface between the ZnSe layer and the ZnSTe layer due to discontinuity in their valence band. As a result, this structure cannot provide an ohmic electrode with a low resistance.

Alternatively, usage of a pseudo-graded superlattice structure including stacked layers of BeTe and ZnSe as a contact layer has been proposed (Appl. Phys. Lett. 64(16), 1994, pp. 2148–2150). In this structure, the lattice mismatch can be made smaller as compared with that in the pseudo-graded superlattice structure of ZnSe/ZnTe, but it is still necessary to control the thicknesses in an atomic layer order of respective layers by repeating epitaxial growth of a short period of time. Therefore, the crystal growth is complicated, and it is difficult to obtain a contact structure of a high quality at high reproducibility.

As described above, in the conventional semiconductor device of a group II-VI compound semiconductor, an appropriate contact layer to be formed between a group II-VI compound semiconductor and a metal electrode has not been found, and it has been difficult to manufacture a semiconductor device having a low operating voltage and high stability at high reproducibility.

SUMMARY OF THE INVENTION

The object of the invention is, in order to overcome the aforementioned conventional problems, obtaining a contact layer with high reproducibility for realizing a semiconductor device with a low operating voltage and a good electric characteristic.

In order to achieve the aforementioned object, the semiconductor device of this invention comprises a semiconductor layer of a p-type group II-VI compound semiconductor formed on a substrate; a first contact layer of $ZnS_wSe_{1-w-x}Te_x$, wherein $0<w<1$, $0<x<1$ and $w+x<1$, formed on the semiconductor layer; a second contact layer of $ZnS_{1-y}Te_y$, wherein $0<y\leq1$, formed on the first contact layer; and an electrode of a metal formed on the second contact layer.

In the semiconductor device of this invention, the first contact layer of $ZnS_wSe_{1-w-x}Te_x$ is formed on the p-type semiconductor layer of a group II-VI compound on the substrate. In this first contact layer, the composition can be changed, while retaining a lattice constant substantially matching with that of the substrate, so that the valence band of the first contact layer can be varied from an energy level continuous with the valence band of the p-type semiconductor layer to an energy level substantially continuous with the valence band of the second contact layer. Furthermore, the second contact layer of $ZnS_{1-y}Te_y$ is formed on the first contact layer, and the valence band of the second contact layer is at an energy level intermediate between the valence band of the first contact layer and the Fermi level of the electrode. Accordingly, the offset in the energy level between the first contact layer and the electrode can be reduced. Moreover, the second contact layer can be doped with a p-type dopant at a high concentration, and owing to the first contact layer, nitrogen doped in the second contact layer at a high concentration can be prevented from diffusing into the p-type semiconductor layer, whose resistance can be easily increased. In this manner, a contact structure having high quality crystallinity and a low resistance can be obtained. As a result, the semiconductor device can be operated at a low voltage and can attain high reliability.

Preferably, in the semiconductor device, the substrate is made from GaAs or ZnSe, and the first contact layer has a composition matching in a lattice size with GaAs or ZnSe in at least a portion thereof closer to the semiconductor layer. Thus, the crystallinity of the first contact layer can be improved and the acceptor density can be increased. Therefore, an excellent contact structure with a low resistance can be obtained, and the contact structure can be stable against current injection and temperature variation.

Preferably, in the semiconductor device, the first contact layer is made from $ZnS_wSe_{1-w-x}Te_x$, wherein $0.2<w\leq0.65$ and $0.05<x\leq0.35$. Thus, the lattice mismatch can be reduced, resulting in further reducing the valence band offset.

Preferably, in the semiconductor device, the first contact layer includes a layer $ZnS_wSe_{1-w-x}Te_x$, wherein $0.3<w\leq0.5$ and $0.1<x\leq0.2$, in a portion thereof closer to the semiconductor layer and a layer of $ZnS_wSe_{1-w-x}Te_x$, wherein $0.4<w\leq0.5$ and $0.2<x\leq0.3$, in another portion thereof closer to the electrode. Thus, the valence band offset can be definitely reduced while retaining the lattice match with the substrate.

Preferably, in the semiconductor device, composition ratios of S and Te in the first contact layer are increased in a direction from the semiconductor layer toward the electrode. Thus, the valence band offset between the p-type group II-VI compound semiconductor such as ZnSe and the second contact layer can be definitely reduced.

When the composition ratios of S and Te are varied in the aforementioned manner, the first contact layer preferably includes plural layers having different compositions. Thus, the valence band offset among the plural layers of the first contact layer can be reduced, and hence, the potential barrier can be definitely reduced and the composition can be easily controlled in forming the layers.

Alternatively, when the composition ratios of S and Te are varied in the aforementioned manner, the first contact layer preferably includes, in at least a portion thereof, a layer whose composition is continuously changed. Thus, the potential barrier derived from the valence band offset among the plural layers of the first contact layer can be made very small.

Preferably, in the semiconductor device, the substrate is made from GaAs or ZnSe, and the second contact layer is made from $ZnS_{1-y}Te_y$, wherein $0.3<y\leq1$. Thus, in the case where the composition ratio y on the interface in contact with the first contact layer is set at a value close to a defined minimum value, since the lattice mismatch with the substrate is small and the valence band of the second contact layer is intermediate between the Fermi level of the electrode and the valence band of the first contact layer, the contact structure can definitely attain high crystallinity and a low resistance.

Preferably, in the semiconductor device, the second contact layer includes a layer of $ZnS_{1-y}Te_y$, wherein $0.3<y<0.4$, in a portion thereof closer to the first contact layer. Thus, the lattice mismatch with the substrate on the interface close to the first contact layer can be definitely made small.

Preferably, in the semiconductor device, the second contact layer includes a layer of ZnTe in a portion thereof closer to the electrode. Thus, the second contact layer can definitely attain a low resistance against the electrode because an acceptor can be introduced into ZnTe at a high concentration.

Preferably, in the semiconductor device, a composition ratio of Te in the second contact layer is gradually increased in a direction from the first contact layer toward the electrode. Thus, the valence band offset between the first contact layer and the electrode can be definitely reduced.

Preferably, in the semiconductor device, the semiconductor layer is made from ZnMgSSe, and the semiconductor device further includes a barrier relieving layer of ZnSe or ZnSSe between the semiconductor layer and the first contact layer. Thus, ZnMgSSe of the semiconductor layer can be suitably used as a cladding layer of a laser structure. At this point, since the barrier relieving layer is disposed between the semiconductor layer and the first contact layer, the barrier relieving layer can definitely reduce the potential barrier formed on the interface between the semiconductor layer and the first contact layer.

The semiconductor light emitting device of this invention comprises a first semiconductor layer of a group II-VI compound of a first conductivity type formed on a substrate; an active layer formed on the first semiconductor layer; a second semiconductor layer of a group II-VI compound of a second conductivity type formed on the active layer; and an electrode of a metal formed on the second semiconductor layer, wherein a first contact layer of $ZnS_wSe_{1-w-x}Te_x$, wherein $0<w<1$, $0<x<1$ and $w+x<1$, and a second contact layer of $ZnS_{1-y}Te_y$, wherein $0<y\leq1$, successively formed on the second semiconductor layer are sandwiched between the second semiconductor layer and the electrode.

In the semiconductor light emitting device of this invention, the first contact layer of $ZnS_wSe_{1-w-x}Te_x$ and the second contact layer of $ZnS_{1-y}Te_y$ successively formed on the second semiconductor layer are sandwiched between the second semiconductor layer and the electrode. Therefore, the effects attained by the aforementioned semiconductor device of the invention can also be exhibited by this semiconductor light emitting device.

Preferably, in the semiconductor light emitting device, the semiconductor light emitting device is a light emitting diode in which the first conductivity type is an n-type and the second conductivity type is a p-type. Thus, a highly reliable pn junction diode operable at a low voltage can be definitely realized.

Preferably, in the semiconductor light emitting device, the semiconductor light emitting device is a vertical cavity surface laser diode in which the first conductivity type is an n-type and the second conductivity type is a p-type. Thus, a highly reliable vertical cavity surface emitting laser diode operable at a low voltage can be definitely realized.

The method of manufacturing a semiconductor of this invention comprises a step of growing, on a substrate, a semiconductor layer of a group II-VI compound including Zn, Se, S and Te by using molecular beams of Zn, Se, S and Te, wherein the molecular beams of Zn, Se, S and Te are generated by using a crystal of ZnSe, a crystal of ZnS and a crystal of ZnTe as sources.

In growing a semiconductor layer including Zn, Se, S and Te by the molecular beam epitaxy (MBE), when simple Zn, Se and Te are used as sources for generating molecular beams of Zn, Se and Te, it takes several tens minutes to stabilize the intensities of the molecular beams because these simple metals have a high vapor pressure. In contrast, in the method of manufacturing a semiconductor of this invention, the compound crystals of ZnSe, ZnS and ZnTe are used as the sources, and hence, the molecular beams can be stabilized in several minutes. As a result, degradation in the interfaces between the semiconductor layers can be avoided, and the throughput of the manufacture process can be improved. Furthermore, since the compound crystals are thus used as the sources, the composition of an alloyed crystal of a group II-VI compound, particularly, a VI/II ratio, can be easily controlled.

DETAILED DESCRIPTION OF THE INVENTION

At present, an ohmic metal electrode with a small resistance cannot be directly formed in p-type ZnSe at high reproducibility. Even when a metal electrode of Au or stacked layers of Au/Pd, which have a comparatively small potential barrier against ZnSe among metals, is used, there exists a barrier of approximately 0.8 eV on the interface between the metal and ZnSe. This is because ZnSe has a wide bandgap and a valence band at a level lower than the Fermi level of the metal. Also, it is difficult to attain a high acceptor density of $2 \times 10^{18}$ cm$^{-3}$ or more by p-type doping on ZnSe. Owing to such a high potential barrier and a low acceptor density, it is very difficult to directly form a metal electrode in p-type ZnSe.

On the other hand, an ohmic electrode can be comparatively easily formed in p-type ZnTe by evaporating a metal electrode of Au or Au/Pd. ZnTe has a narrow bandgap of 2.26 eV, and its valence band level is higher than that of ZnSe and is closer to the Fermi level of the metal. Therefore, a potential barrier between ZnTe and the metal electrode is smaller. Moreover, the acceptor density can be increased up to approximately $1 \times 10^{19}$ cm$^{-3}$ through $1 \times 10^{20}$ cm$^{-3}$ by nitrogen doping. Thus, p-type ZnTe is advantageous in forming an electrode with a low resistance.

Accordingly, as a contact material for ZnSe, p-type ZnTe is favorable. However, when p-type ZnSe and p-type ZnTe are mutually joined, a large potential barrier is formed on the interface therebetween owing to discontinuity in the valence band.

As a result of various examinations on means for allowing a contact layer, which is formed in a group II-VI compound semiconductor, particularly, a p-type ZnSe crystal, to have an ohmic property at high reproducibility, the present inventors have found the following: A first alloyed crystal layer of $ZnS_wSe_{1-w-x}Te_x$ (wherein 0<w<1, 0<x<1 and w+x<1) and a second alloyed crystal layer of $ZnS_{1-y}Te_y$ (wherein 0<y<1) are successively formed between the p-type ZnSe crystal and a metal electrode in this order on the ZnSe crystal. Thus, the valence band level can be varied in a wide range while retaining a lattice match with a semiconductor substrate such as a GaAs substrate.

Now, this phenomenon will be described with reference to the accompanying drawings.

Figure 1:
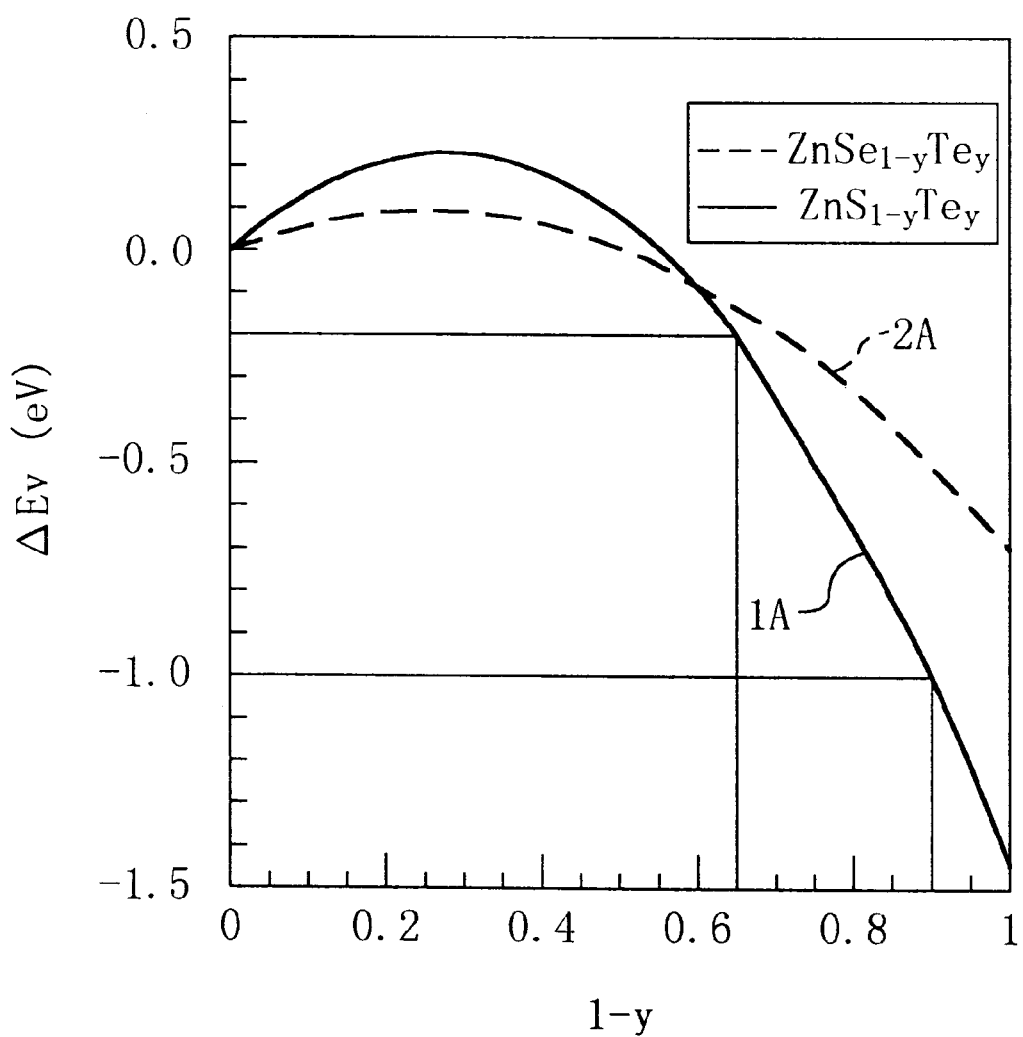
FIG. 1 is a graph for showing composition dependency of a valence band offset of a ZnSTe alloyed crystal and a ZnSeTe alloyed crystal of the invention from ZnTe.

FIG. 1 illustrates composition dependency of the valence band offset of a ZnSTe alloyed crystal and a ZnSeTe alloyed crystal from ZnTe. In this case, photoluminescence of these characteristic of the valence band offset ΔEv of the alloyed crystals.

Figure 2:
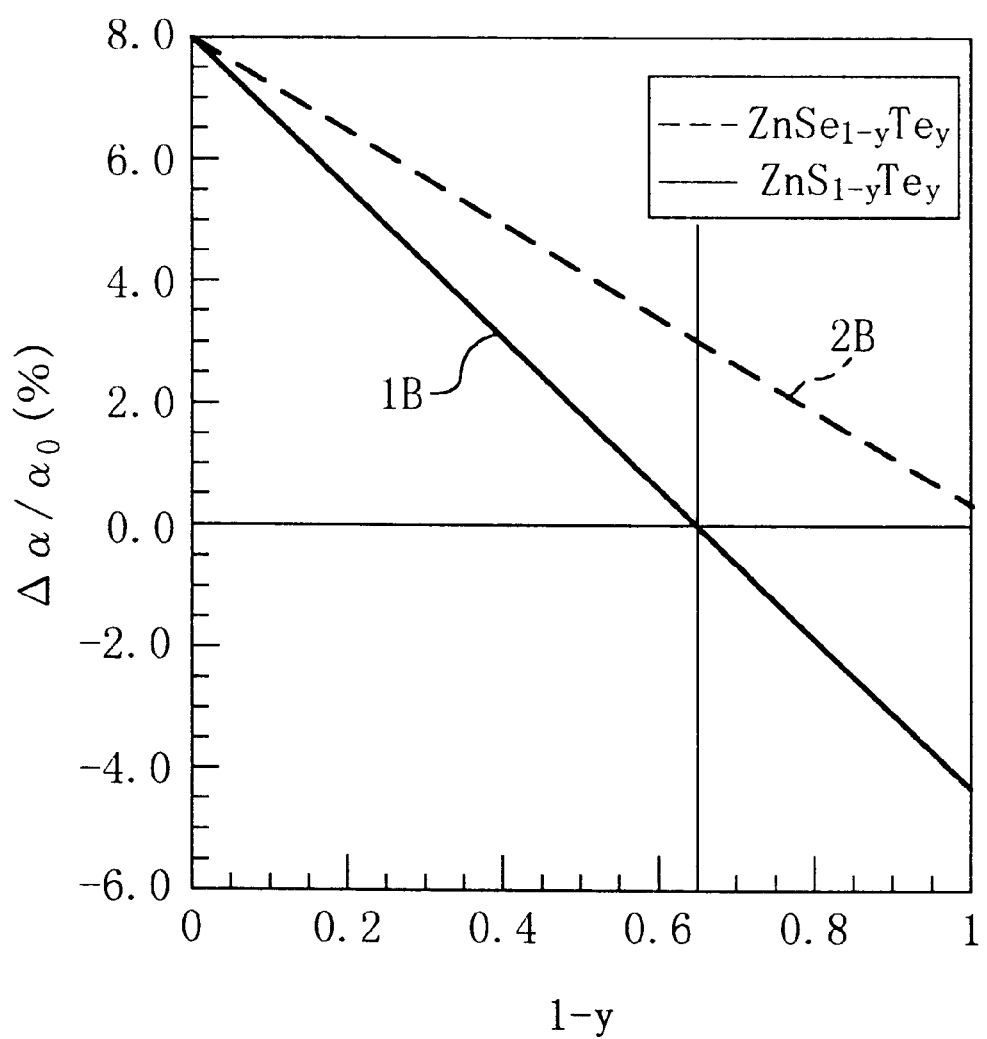
FIG. 2 is a graph for showing composition dependency of lattice mismatches of the ZnSTe alloyed crystal and the ZnSeTe alloyed crystal of the invention.

FIG. 2 illustrates composition dependency of lattice mismatches of the ZnSTe alloyed crystal and the ZnSeTe alloyed crystal. In FIG. 2, the ordinate indicates a proportion $\Delta\alpha/\alpha_0$ of the lattice mismatch between each alloyed crystal and a GaAs substrate, and the abscissa indicates the composition ratio of S in the ZnSTe alloyed crystal and the composition ratio of Se in the ZnSeTe alloyed crystal. As is obvious from FIG. 2, when the composition ratio of Te is smaller than 0.35, an alloyed crystal substantially completely matching in lattice size with the substrate can be obtained by using the ZnSSeTe alloyed crystal.

In view of the results shown in FIGS. 1 and 2, a contact layer having a small valence band offset and small lattice mismatch with a substrate can be obtained by utilizing the bowed characteristic of the valence band offset of the ZnSSeTe alloyed crystal.

For example, the valence band offset ΔEv between ZnSe and ZnTe is approximately 0.69 eV, but by using the ZnSSeTe alloyed crystal, while retaining a lattice constant substantially matching with that of the GaAs substrate, the valence band can be changed from an energy level continuous with that of p-type ZnSe or the like to an energy level substantially continuous with those of ZnTe and $ZnS_{1-y}Te_y$ alloyed crystals where the composition ratio y of Te is in a range of $0.3<y\leq 1$.

Furthermore, the present inventors have found the following: When radical nitrogen doping is conducted on the ZnSSeTe alloyed crystal, p-type doping sufficient as a part of a contact layer can be attained. In ZnTe and a $ZnS_{1-y}Te$ alloyed crystal where the composition ratio y of Te is $0.3<y\leq 1$, p-type doping up to a higher concentration can be attained.

Moreover, in the $ZnS_{1-y}Te_y$ (wherein $0.3<y\leq 1$) alloyed crystal doped with a p-type dopant at a high density, the offset in the energy level from a metal electrode is also small. Therefore, this alloyed crystal can easily realize a contact with a low resistance against a metal electrode of Au, Pd, Pt or the like.

However, when the $ZnS_{1-y}Te_y$ ($0.3<y\leq 1$) alloyed crystal is directly formed on a group II-VI compound semiconductor such as p-type ZnSe, p-type ZnSSe and p-type ZnMgSSe, a large valence band offset is caused between the group II-VI compound semiconductor and the $ZnS_{1-y}Te_y$ alloyed crystal. As a result, a potential barrier is formed on the interface therebetween, and hence, the resultant electrode has a high resistance.

On the other hand, the ZnSSeTe alloyed crystal substantially matches in the lattice size with a group II-VI compound semiconductor having a wide bandgap such as p-type ZnSe, p-type ZnSSe and p-type ZnMgSSe, and can be brought to contact with such a semiconductor without causing a valence band offset. However, when a metal electrode is directly formed on the ZnSSeTe alloyed crystal, there remains an offset between the Fermi level of the metal electrode and the valence band of the ZnSSeTe alloyed crystal. In addition, the acceptor density cannot be very high, and hence, it is difficult to obtain a contact with a low resistance. alloyed crystals in the superlattice structure is measured. In FIG. 1, the ordinate indicates the valence band offset $\Delta Ev$ of each alloyed crystal from ZnTe, and the abscissa indicates a composition ratio 1-y of the $ZnS_{1-y}Te_y$ alloyed crystal and $ZnSe_{1-y}Te_y$, namely, the composition ratios of S in the ZnSTe alloyed crystal and Se in the ZnSeTe alloyed crystal. Also, the valence band offset corresponds to a difference in the energy level of the valence band of each crystal from that of ZnTe.

In FIG. 1, the valence band offset $\Delta Ev$ of the ZnSTe alloyed crystal shown with a curve 1A and that of the ZnSeTe alloyed crystal shown with a curve 2A are not linearly changed in accordance with the change of their compositions but changed as curves largely bowing (i.e., having a larger curvature) upward. In particular, the curve 1A indicating the valence band offset of the ZnSTe alloyed crystal is largely bowed. Since the valence band offset is thus bowed, for example, in the ZnSTe alloyed crystal shown with the curve 1A, the valence band offset $\Delta Ev$ is -1.0 V when the composition ratio of S is 0.9 while the valence band offset $\Delta Ev$ becomes as small as -0.2 V when the composition ratio of S is decreased to 0.65. Also, on the basis of the result shown in this graph, it has been found that the valence band offset of a ZnSSeTe alloyed crystal, having an intermediate composition between the ZnSTe alloyed crystal and the ZnSeTe alloyed crystal, is similarly bowed.

In view of the aforementioned result, the valence band offset from ZnTe can be made small even when the composition ratio of Te is comparatively small by utilizing the bowed According to the present invention, between a p-type group II-VI compound semiconductor and a metal electrode, a lower layer of a ZnSSeTe alloyed crystal layer is formed, and an upper layer of a $ZnS_{1-y}Te_y$ (wherein $0<y\leq 1$) alloyed crystal layer is formed on the lower layer. In this manner, a contact structure with a low resistance can be realized.

This is because the combination of the ZnSSeTe alloyed crystal and the $ZnS_{1-y}Te_y$ (wherein $0<y\leq 1$, and preferably $0.3<y\leq 1$) alloyed crystal can exhibit the following specific effects:

1) While the ZnSSeTe alloyed crystal retaining a lattice constant substantially matching with that of a substrate, the valence band can be changed from an energy level continuous with that of p-type ZnSe or the like to an energy level continuous with or sufficiently close to the valence band of the $ZnS_{1-y}Te_y$ alloyed crystal;

2) The valence band of the $ZnS_{1-y}Te_y$ alloyed crystal is at an energy level intermediate between the Fermi level of a metal electrode and the valence band of the ZnSSeTe alloyed crystal, resulting in reducing the offset therebetween;

3) The p-type doping can be conducted to a high density in the $ZnS_{1-y}Te_y$ alloyed crystal; and 4) By using the ZnSSeTe alloyed crystal, excessive nitrogen included in the $ZnS_{1-y}Te_y$ alloyed crystal can be prevented from diffusing to the p-type group II-VI compound semiconductor whose resistance can be easily increased.

As described above, when a group II-VI compound semiconductor is provided with a contact structure according to this invention, the contact can match in the lattice size with the group II-VI compound semiconductor, and a potential barrier derived from band discontinuity between ZnSe and ZnTe or between ZnSe and the metal electrode can be suppressed.

Moreover, by using the ZnSSeTe alloyed crystal in the lower layer, namely, a layer closer to the compound semiconductor layer in the contact structure, the resistance can be prevented from increasing due to nitrogen diffusion from the upper layer closer to the electrode. Therefore, a highly reliable semiconductor device including a group II-VI compound semiconductor with a low operating voltage, which cannot be attained by the conventional technique, can be realized.

As the group II-VI compound semiconductor, a compound including at least one of bivalent elements selected from the group consisting of Zn, Cd, Mg, Mn and Ca, and at least one of group VI elements selected from the group consisting of S and Se is preferably used. For example, when $Zn_xCd_{1-x}S_ySe_{1-y}$, $Zn_xMg_{1-x}S_ySe_{1-y}$ or $Zn_xMn_{1-x}S_ySe_{1-y}$ wherein $0\leq x\leq 1$ and $0\leq y\leq 1$) is used, the lattice constant can be varied in a wide range between 0.53 nm and 0.67 nm, and hence can be matched with the lattice constant of a substrate or the like where the semiconductor device is formed.

The p-type group II-VI compound semiconductor herein basically means group II-VI compound semiconductors excluding alloyed crystals of ZnSSeTe and ZnSTe used as a contact layer.

Also, the contact structure of this invention is effective in group II-VI compound semiconductors having a wide gap, such as ZnSe, ZnSSe, ZnMgSSe, ZnMnSSe, ZnCdSe, ZnCdS and ZnS, which is difficult to provide a p-type ohmic contact with a low resistance when a metal electrode is directly evaporated thereon.

A p-type semiconductor layer is obtained by doping the p-type group II-VI compound semiconductor of this invention, namely, the semiconductor included in the contact structure of ZnSSeTe and ZnSTe, with nitrogen. Alternatively, the p-type semiconductor layer can be obtained by doping the semiconductor with Li, Na, K, Rb, Cu, Ag, Au, P, As, Sb or Bi.

In a conventional semiconductor laser diode including an active layer sandwiched between an n-type cladding layer and a p-type cladding layer of a group II-VI compound semiconductor, and a metal electrode formed on the p-type cladding layer, the operating voltage is disadvantageously increased and the device efficiency is degraded due to a potential barrier formed between the p-type cladding layer and the metal electrode, and the device degradation is caused due to lattice defects in the semiconductor. When the p-type contact structure of this invention is adopted, it is possible to obtain a high quality device having few defects and a low operating voltage. As a result, a highly efficient and reliable semiconductor laser diode, which cannot be conventionally attained, can be realized at high reproducibility.

EMBODIMENT 1

A first embodiment of the invention will now be described with reference to the accompanying drawings.

Figure 3:
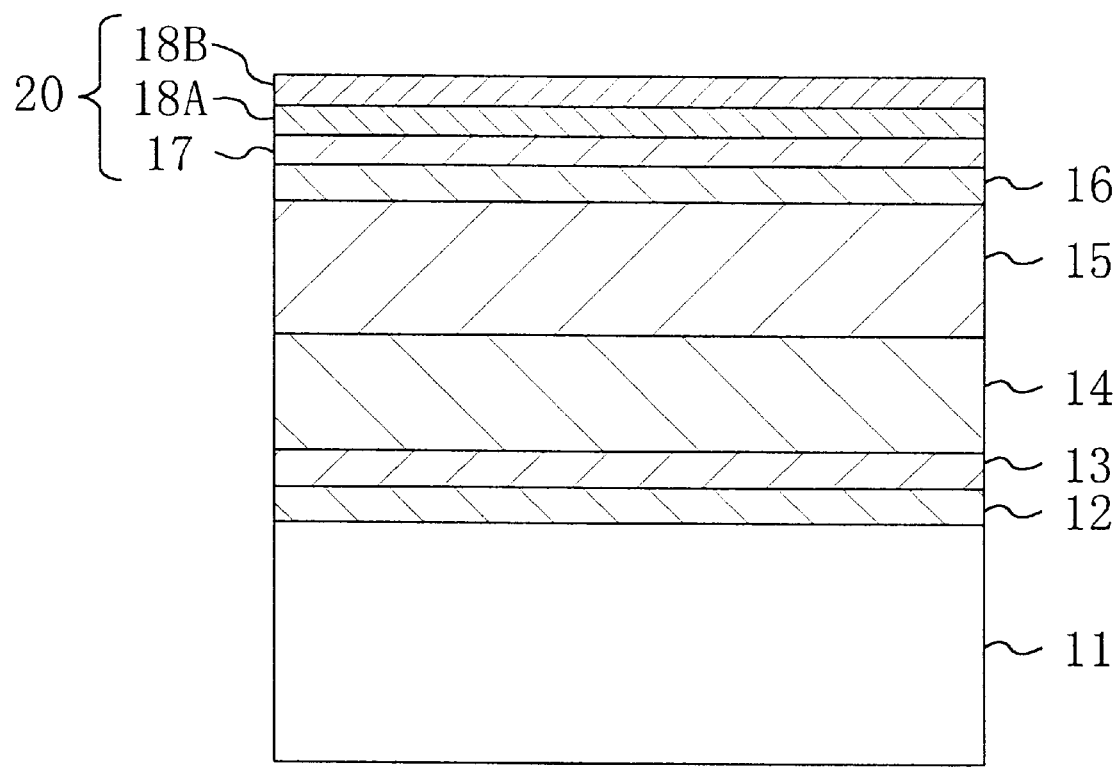
FIG. 3 is a sectional view of a group II-VI compound semiconductor according to a first embodiment of the invention.

FIG. 3 illustrates the sectional structure of a group II-VI compound semiconductor according to the first embodiment. In the compound semiconductor of FIG. 3, a first buffer layer 12 of undoped GaAs with a thickness of 0.5 $\mu$m, a second buffer layer 13 of undoped ZnSe with a thickness of 10 nm and an undoped layer 14 of $ZnS_{0.06}Se_{0.94}$ with a thickness of 500 nm are successively formed on a substrate 11 of semi-insulating GaAs. On the undoped layer 14, as p-type group II-VI compound semiconductors, for example, a first p-type layer 15 of p-type $ZnS_{0.06}Se_{0.94}$ with a thickness of 1 $\mu$m and an impurity concentration of $5\times10^{17}$ cm$^{-3}$ and a second p-type layer 16 of p-type ZnSe with a thickness of 20 nm and an impurity concentration of $5\times10^{17}$ cm$^{-3}$ are formed. On the second p-type layer 16, a p-type contact structure 20 is formed.

The p-type contact structure 20 includes, for example, a first layer 17 serving as a first contact layer of p-type $ZnS_{0.4}Se_{0.4}Te_{0.2}$ with a thickness of 10 nm, a second layer 18A of p-type $ZnS_{0.65}Te_{0.35}$ with a thickness of 10 nm and a third layer 18B of p-type $ZnS_{0.5}Te_{0.5}$ with a thickness of 5 nm together serving as a second contact layer. Thus, an energy difference in the valence band between adjacent layers in the contact structure 20 can be approximately 0.3 eV or less, and hence, a low operating voltage can be achieved.

In this embodiment, each of the first, second and third layers 17, 18A and 18B included in the p-type contact structure 20 has a thickness of approximately 10 nm, and hence, their thicknesses can be sufficiently controlled by the MBE or the metal organic vapor phase epitaxial growth (MOVPE). Accordingly, the contact structure can be formed in good uniformity.

Also in this embodiment, the valence band offset $\Delta Ev$ is suppressed to approximately 0.2 eV through 0.3 eV between the second p-type layer 16 and the respective semiconductor layers of the p-type contact structure 20. Therefore, a potential barrier against holes can be sufficiently reduced.

Furthermore, since the first layer 17 of the p-type contact structure 20 is made from a quaternary alloyed crystal, the layer can be improved in its hardness and can be more resistant against the occurrence of crystal defects.

Moreover, since the first layer 17 and the second layer 18A of the p-type contact structure 20 are both matched in the lattice size with the substrate 11, the respective semiconductor layers formed on the substrate 11 up to the second layer 18A can be grown as high quality crystals including substantially few crystal defects. Also, the third layer 18B of the p-type contact structure 20 is not completely matched in the lattice size with the substrate 11, but the lattice mismatch ratio between the third layer 18B and the substrate 11 is as small as approximately 1.8% while that between a ZnTe crystal and the substrate 11 is 8%. Therefore, when the thickness of the third layer 18B is comparatively small, i.e., approximately 10 nm, the third layer 18B can be formed as a high quality crystal including few crystal defects.

Since the third layer 18B of p-type $ZnS_{0.05}Te_{0.5}$ has substantially the same valence band level as ZnTe as described above, the third layer 18B can be substantially ohmic with a metal electrode when the acceptor density is sufficiently high.

Furthermore, the offset in the valence band between the second p-type layer 16 and ZnTe or between the second p-type layer 16 and the third layer 18B is substantially divided into three parts by the two layers, that is, the first layer 17 and the second layer 18A. Accordingly, when the crystallinity of the respective alloyed crystal layers 17, 18A and 18B of the p-type contact structure 20 is improved, the potential barrier derived from the band discontinuity can be effectively reduced, resulting in attaining a good current-voltage characteristic.

Moreover, in the p-type contact structure 20 of this embodiment, the resistance increase in the respective layers, in particular, in the second p-type layer 16, derived from diffusion of nitrogen can be suppressed. This effect is regarded to be brought about as follows: Since the p-type contact structure 20 working as a barrier releaving area has good crystallinity, the density of inactive nitrogen is small and the number of the lattice defects for accelerating the diffusion is small in the contact structure. As a result, the inactive nitrogen can be suppressed from diffusing.

On the third layer 18B of the p-type contact structure 20, a p-type ZnTe layer can be further provided. In this case, when this p-type ZnTe layer has a thickness of 2 nm through 5 nm, the p-type contact structure 20 can be less affected by lattice strain applied thereto without degrading the electric characteristic. As a result, the reliability can be further improved.

Specifically, while the valence band offset between the third layer 18B and ZnTe is small, the nitrogen doping efficiency is higher in ZnTe and a higher acceptor density can be attained in ZnTe. Therefore, the potential barrier formed between the contact structure and a metal can be reduced by providing the ZnTe layer. Although the crystallinity of the ZnTe layer is slightly degraded because the lattice mismatch between ZnTe and the substrate 11 is as large as 8%. However, the ZnTe layer can be formed in a smaller thickness as compared with that in the conventional contact structure, and hence, strain applied to the entire p-type contact structure 20 can be made sufficiently small. Also, the valence band offset is small and the potential barrier is small on the interface between the third layer 18B and the ZnTe layer where strain is caused. Therefore, the degradation in the crystallinity less affects the current-voltage characteristic.

As described so far, the first layer 17 of $ZnS_{0.4}Se_{0.4}Te_{0.2}$ is provided between the second p-type layer 16 of ZnSe and the second layer 18A of $ZnS_{0.65}Te_{0.35}$ and the third layer 18B of $ZnS_{0.5}Te_{0.5}$ in this embodiment. As a result, the valence band offset between the layers 16, 17, 18A and 18B can be suppressed to 0.3 eV or less.

In this case, the first layer 17 of ZnSSeTe working as the first contact layer can be formed as a stacked substance including plural layers having different compositions. For example, when the first layer 17 is formed as a stacked substance including five layers of $ZnS_{0.22}Se_{0.68}Te_{0.1}$, $ZnS_{0.31}Se_{0.54}Te_{0.15}$, $ZnS_{0.4}Se_{0.4}Te_{0.2}$, $ZnS_{0.47}Se_{0.28}Te_{0.25}$ and $ZnS_{0.56}Se_{0.14}Te_{0.30}$ successively formed on the second p-type layer 16, the resultant structure can substantially match in the lattice size with the substrate 11 of GaAs, and the band offset can be suppressed to 0.2 eV or less. As a result, even when doping is conducted to attain merely a small acceptor density in each semiconductor layer, the resultant electric characteristic can be satisfactory. It goes without saying that the composition of ZnSSeTe can be intermediate among or close to the aforementioned compositions of the five layers.

In this embodiment, the second p-type layer 16 of ZnSe is provided between the first p-type layer 15 of $ZnS_{0.06}Se_{0.94}$ and the p-type contact structure 20, but the second p-type layer 16 is not indispensable.

Also in this embodiment, the crystal compositions are abruptly changed between the adjacent layers among the layers 17, 18A and 18B of the p-type contact structure 20, so as to form definite interfaces therebetween. However, the interfaces between the adjacent layers can be eliminated by providing a graded composition layer, where the crystal composition is gradually varied, between each adjacent layers, so that the effect of the potential barrier can be further suppressed. In this case, the compositions in the vicinity of the upper and lower interfaces of the graded composition layer substantially accord with the compositions of the layers adjacent with the interfaces sandwiched. In this manner, when each graded composition layer between the adjacent layers has a thickness of 5 nm through 50 nm, the offset on the interface can be effectively reduced, and the growth and thickness can be easily controlled by the MBE or the MOVPE. As a result, the contact structure can be formed in further higher uniformity. Also, when the graded composition layers are thus disposed between adjacent layers, the thickness of each of the layers other than the graded composition layers can be 10 nm or less.

Moreover, when at least a part of the alloyed crystal layers 17, 18A and 18B included in the p-type contact structure 20 has a structure with a graded composition, namely, a structure where the composition is continuously varied so as to gradually change the valence band level, the effect of the potential barrier can be further suppressed. In the case where the entire p-type contact structure 20 has the structure having the graded composition, the thickness can be sufficiently controlled by the MBE or the MOVPE by setting the thickness at 50 nm through 500 nm. As a result, the contact structure can be formed in good uniformity.

Also in this embodiment, each of the alloyed crystal layers 17, 18A and 18B included in the p-type contact structure 20 has a thickness of approximately 10 nm. However, when the thickness is 2 nm through 30 nm, the occurrence of the crystal defects and degradation factors such as nitrogen diffusion during the growth can be suppressed because the layer with such a thickness can be grown in a sufficiently short period of time.

On the other hand, when each of the alloyed crystal layers 17, 18A and 18B has a thickness of 20 nm through 300 nm, the plane uniformity in each alloyed crystal can be further improved during the crystal growth.

Accordingly, when each of the alloyed crystal layers 17, 18A and 18B has a thickness of 5 nm through 100 nm, the layer can be grown in a comparatively short period of time in good plane uniformity through well controlled crystal growth.

Furthermore, since the ZnSSeTe alloyed crystal is used in the first contact layer 17, the p-type contact structure 20 can be easily grown and accurately controlled in its composition, resulting in decreasing the strain within the p-type contact structure 20. However, when a superlattice structure including plural layers having different compositions, for example, a superlattice structure including a p-type $ZnS_{0.65}Te_{0.35}$ layer and a ZnSe layer is used, the contact structure can be formed and its composition can be controlled by using of an easily operable growth system having a simplified structure.

As the second contact layers 18A and 18B, the ZnTe or ZnSTe alloyed crystal is used in this embodiment, but a superlattice structure including plural layers having different compositions, for example, a superlattice structure of a p-type $ZnS_{0.65}Te_{0.35}$ layer and a ZnTe layer can be used instead.

Furthermore, when a metal electrode is directly formed on the first layer 18A of the p-type contact structure 20, the strain derived from the lattice mismatch can be further suppressed.

Moreover, the p-type contact structure 20 including the plural layers or having the continuously varied composition can be formed to have a composition in which the valence band level is changed continuously or in a stepwise manner from an energy level close to that of a group II-VI compound semiconductor such as ZnSe and $ZnS_{0.06}Se_{0.94}$ to an energy level close to the Fermi level of a metal electrode of Au or the like. Thus, the potential barrier derived from the valence band offset between the group II-VI compound semiconductor and the metal electrode can be effectively reduced.

Furthermore, when the $ZnS_{1-y}Te_y$ alloyed crystal included in the third layer 18B of the p-type contact structure 20 has, in a portion closer to the metal electrode, a composition having a high valence band level (namely, closer to the Fermi level of the metal) even if there is a small lattice mismatch with the substrate 11, the potential barrier on the interface in contact with the metal can be further reduced. Specifically, $ZnS_{0.5}Te_{0.5}$ or ZnTe can be adopted as the composition.

Now, a method of manufacturing the aforementioned group II-VI compound semiconductors will be described.

First, the respective group II-VI compound semiconductor layers 13 through 18B are grown by, for example, the MBE on the first buffer layer 12 of undoped GaAs grown on the substrate 11 of GaAs. In growing the p-type layers 15 through 18B, nitrogen is supplied through radical doping for introducing active nitrogen molecules. In general, simple metal sources are used as Zn, Se and Te to be contained in crucibles of cells in the MBE for growing an alloyed crystal of ZnSSe or ZnTe. As a S source, a ZnS compound is used. However, since a simple metal source has a high vapor pressure, it takes a rather long period of time to stabilize the intensity of a molecular beam. For example, with regard to Zn, the intensity of the molecular beam is $1\times10^{-7}$ Torr on standby at a cell temperature of 220° C., and it takes more than 40 minutes to stably control the molecular beam to attain the molecular beam intensity of $1\times10^{-6}$ Torr for the growth at the cell temperature of 300° C.

When such a method is adopted for forming the plural alloyed crystal layers of this embodiment, the growth should be suspended for more than 30 minutes before growing every subsequent semiconductor layer, during which the interface between the layers can be degraded. As a result, the characteristic of the resultant device can be disadvantageously largely affected. Also, a time required for the entire growth process is disadvantageously elongated.

However, in this embodiment, a ZeSe compound crystal and a ZnTe compound crystal are used as the sources to be contained in the cell, and therefore, the aforementioned disadvantages can be overcome.

Specifically, when the ZnSe compound is used as the source, it takes approximately merely 5 minutes to stably control the molecular beam from the intensity of $2\times10^{-7}$ Torr on standby at the cell temperature of 820° C. to the intensity of $2\times10^{-6}$ Torr for the growth at the cell temperature of 880° C.

The beam intensity can be thus easily controlled at a higher cell temperature probably for the following reason: Heat is released from a cell within a vacuum chamber not through conduction but mainly through radiation. In this case, the radiation efficiency is in proportion to the fourth power of a temperature, and hence is largely decreased at a low temperature. As a result, the cell has a poor heat releasing efficiency and has a low cooling speed at a low temperature. Therefore, it takes a long period of time to decrease the cell temperature. Furthermore, since the heat releasing efficiency is poor, a heat response speed is low, and hence, it takes a long time to reach a thermally steady state also by increasing the temperature. Accordingly, the molecular beam intensity is difficult to control when the cell temperature is low.

In order to continue the growth with the composition of the alloyed crystal changing, it is necessary to increase/decrease the temperature accurately and in a short period of time, but the cell at a low temperature having a low heat response speed cannot follow the change of the temperature. Also, at a low temperature of approximately 200° C. through 300° C., the cell can be easily affected by room temperature because of a small difference from the room temperature. Therefore, it is difficult to control the molecular beam intensity.

The crystallinity of a group II-VI compound semiconductor and the doping condition largely depend upon a VI/II ratio between a total supply amount of the group VI sources (S, Se and Te) and a total supply amount of the group II sources (Zn and Cd). In particular, in order to obtain a p-type group II-VI compound semiconductor with good crystallinity, the VI/II ratio should be highly accurately controlled. When the VI/II ratio is too large, the doping efficiency is so degraded that p-type conduction with a low resistance cannot be attained. When the VI/II ratio is too small, the doping efficiency can be improved but the crystallinity is significantly degraded.

In forming the p-type contact structure 20 of this embodiment, when the conventional simple metal sources are used, it is necessary to control the VI/II ratio within a range where the crystallinity and the doping efficiency can be compatible in each alloyed crystal with each composition, and also to control a proportion in the supply amount of each of the group VI and II sources so as to grow an alloyed crystal with a desired composition. Every time the composition of the alloyed crystal is changed, these two factors should be controlled, and therefore, the operation and the condition for the crystal growth are complicated. In addition, the dose can be varied and the crystallinity can be degraded due to the variation of the VI/II ratio in each layer. Therefore, it is difficult to realize desired crystal growth with good reproducibility.

Moreover, in adopting the structure with the graded composition excluding an interface where the crystal composition is abruptly changed, it is very difficult to retain a desired VI/II ratio in each semiconductor layer by using the conventionally used simple metal sources.

According to the manufacture method of this embodiment, since the compound crystals of ZnSe, ZnTe and ZnS are used as the sources, the supply ratio among the group VI and II elements supplied from the respective sources can be a given ratio substantially equal to 1. Therefore, the VI/II ratio can be constant in all the semiconductor layers without special control.

The present inventors have found the following: The respective alloyed crystals of ZnSTe, ZnSeTe and ZnSSeTe can be grown while retaining good crystallinity in the entire range of the composition ratios in accordance with the supply ratio among the group VI and II elements supplied from the compound sources of ZnSe, ZnTe and ZnS; and thus, the p-type doping for attaining a low resistance can be realized in each of the semiconductor layers.

Accordingly, during the crystal growth, by paying an attention to merely the supply ratio among the compound sources for attaining a desired alloyed crystal composition, the crystal can be easily grown and the reproducibility can be improved. Furthermore, the method of this embodiment is also effective in manufacturing the group II-VI compound semiconductor having the graded composition with good crystallinity under a desired doping condition.

Figure 4:
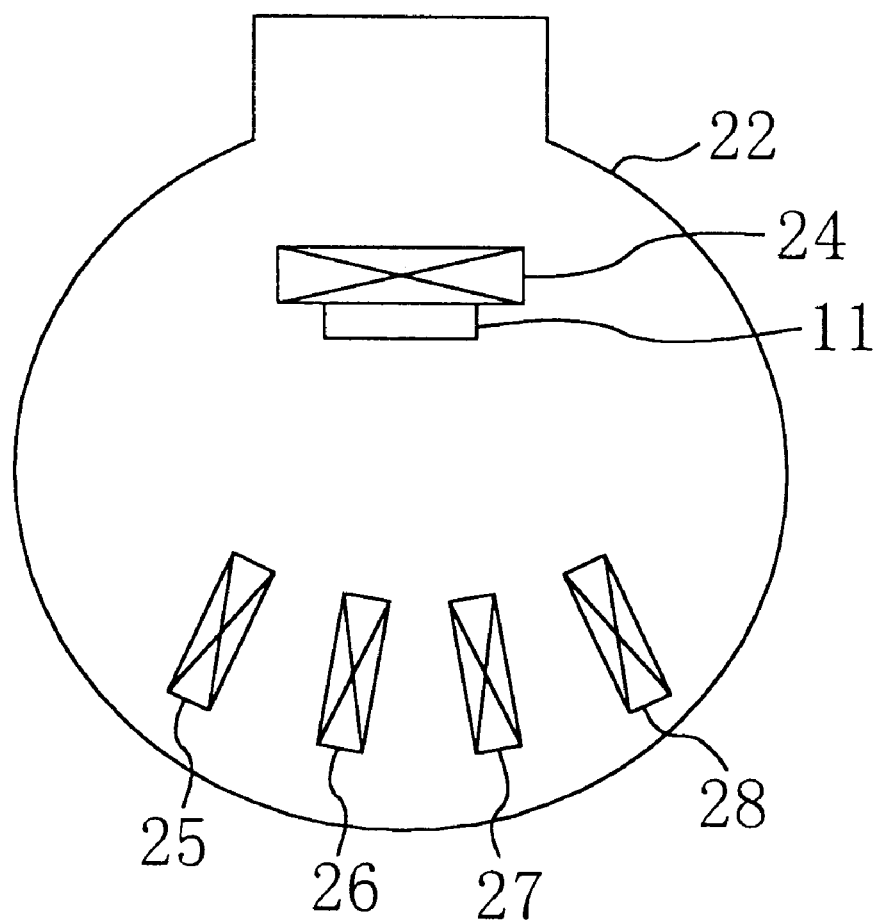
FIG. 4 is a diagram for showing the structure of an MBE system used in a method of manufacturing a semiconductor of the first embodiment.

FIG. 4 shows the schematic structure of an MBE system used in the method of manufacturing a semiconductor of this embodiment. As is shown in FIG. 4, the MBE system 21A includes a vacuum chamber 22 which can be retained in ultra-high vacuum. In the vacuum chamber 22, substrate holding means 24 including holding means for holding the substrate 11, heating means for heating the substrate 11 and rotating means for rotating the substrate 11 on its plane is disposed. Also in the vacuum chamber 22, first through third K cells 25 through 27 serving as thermal evaporation sources, each of which includes an emission portion of a corresponding molecular beam opposing the surface of the substrate 11, and a radical nitrogen gun 28 for emitting radical nitrogen used as a p-type dopant are disposed.

The first K cell 25 contains, for example, the compound source of a ZnSe crystal, the second K cell 26 contains, for example, the compound source of a ZnS crystal, and the third K cell 27 contains, for example, the compound source of a ZnTe crystal. At this point, the temperature of the first K cell 25 is 700° C. through 800° C., the temperature of the second K cell 26 is 800° C. through 900° C., and the temperature of the third K cell 27 is 500° C. through 800° C. Although not shown in the drawing, another K cell containing a simple metal source of Zn or Se or substrate introducing means can be provided if necessary.

The substrate 11 on which the respective semiconductor layers have been grown is taken out of the vacuum chamber 22 of the MBE system 21A. Then, on the p-type contact structure 20, Pd and Au are evaporated in the shape of dots into thicknesses of 10 nm and 200 nm, respectively by the vacuum evaporation. Thus, the metal electrode is formed. Subsequently, the portion of the p-type contact structure 20 where the metal electrode is not formed is removed by etching.

Figure 5:
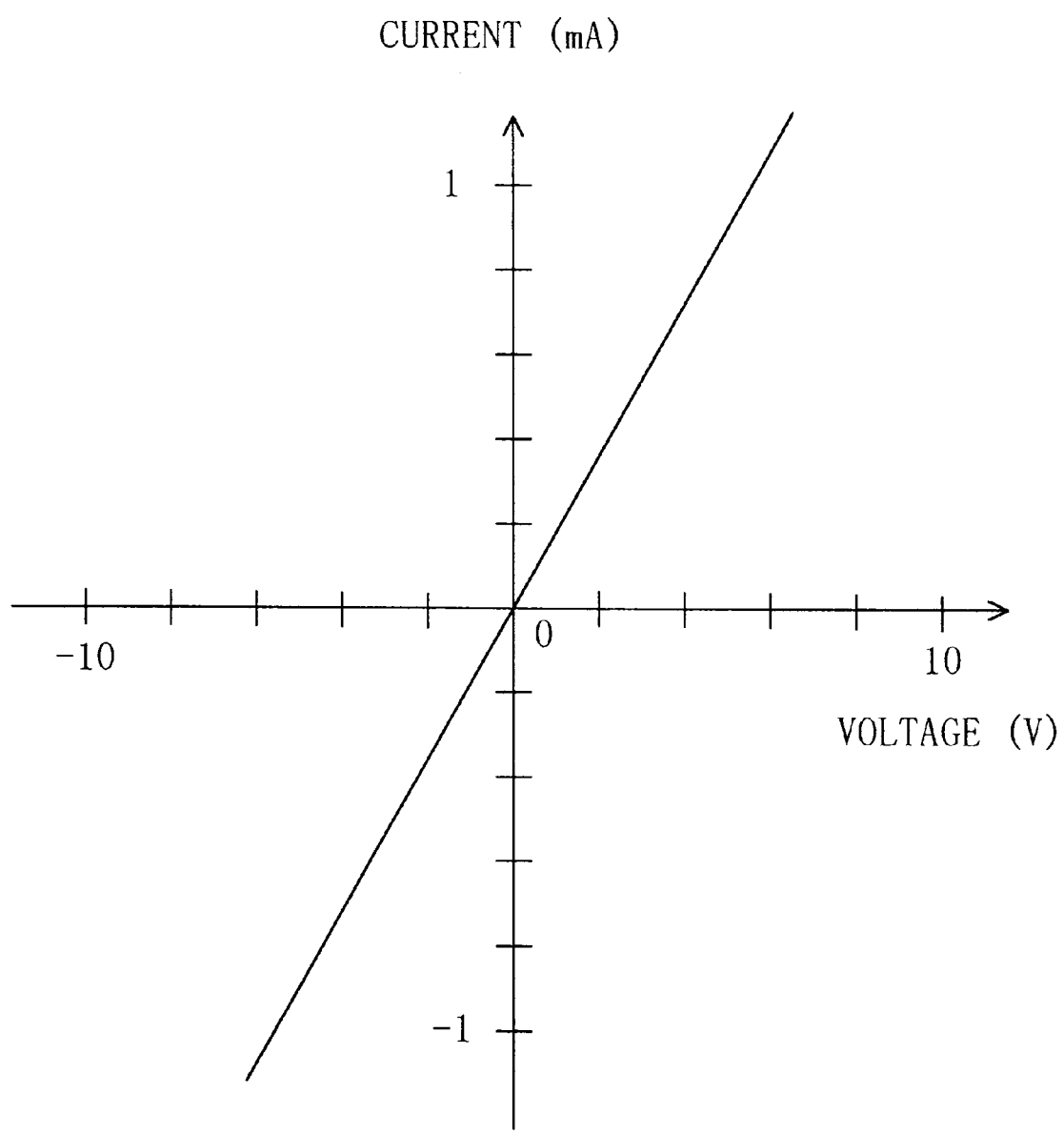
FIG. 5 is a diagram for showing a current-voltage characteristic obtained by the group II-VI compound semiconductor and a metal electrode of the first embodiment.

FIG. 5 shows a current-voltage (I-V) characteristic of the metal electrode on the semiconductor layers manufactured as described above. Since the resistance is as low as 5.4 KΩ and the I-V characteristic has a linear property passing through the origin as is shown in FIG. 5, this metal electrode is found to be a good ohmic electrode. Furthermore, the obtained electrode is good in adhesion and uniformity with the semiconductor, and the surface thereof is plane and mechanically stable. Therefore, wiring such as wire bonding can be easily conducted thereon.

In addition, few lattice defects can be found in the p-type contact structure 20, the electric characteristic is stable, and the reproducibility and the reliability are excellent. Furthermore, the electric characteristic is not largely affected by a heat treatment at a temperature up to approximately 250° C., and the characteristic is observed to be stable against current injection.

As described above, when the p-type contact structure 20 of this embodiment is adopted, a good ohmic property, high reproducibility and high reliability can be achieved.

Figure 6:
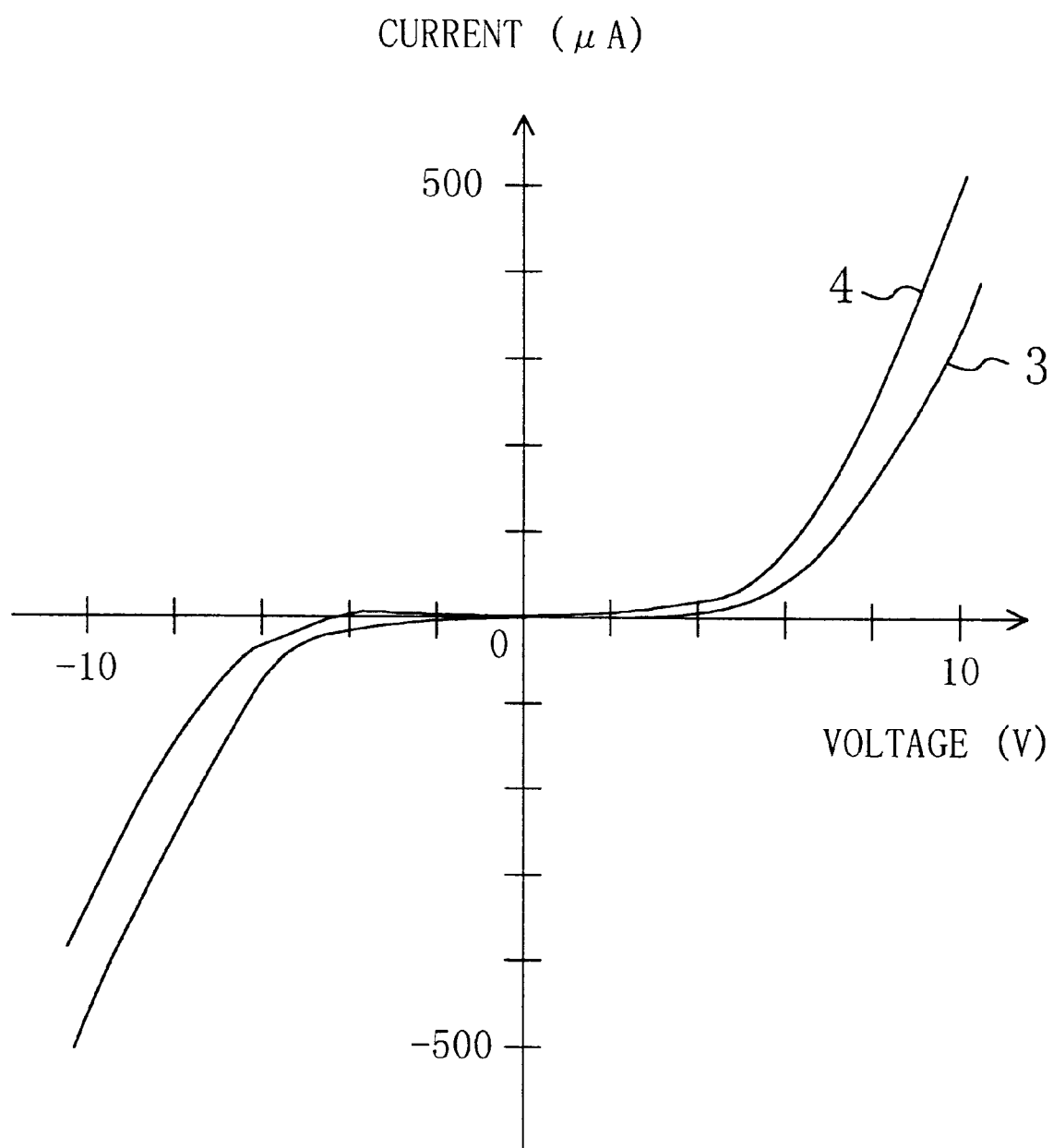
FIG. 6 is a diagram for showing a current-voltage characteristic obtained by a conventional group II-VI compound semiconductor and a metal electrode.

On the other hand, FIG. 6 shows a current-voltage characteristic for comparison obtained by directly forming a metal electrode of Au/Pd on the second p-type layer 16 without forming the p-type contact layer 20. In FIG. 6, a curve 3 corresponds to the I-V characteristic attained before annealing, and a curve 4 corresponds to the I-V characteristic attained after annealing for 5 minutes. As is shown with the curve 4, the electric characteristic of the metal electrode is slightly improved through the annealing, but the offset voltage of the I-V characteristic is as high as approximately 6 V, and a Schottky type characteristic is exhibited. Also, the differential resistance in this electrode is approximately 10 KΩ, which is approximately twice as high as that of the electrode of this embodiment.

Although the MBE is adopted for the growth of the semiconductor layers in this embodiment, the MBE can be replaced with the MOVPE. This also applies to any of the following embodiments.

EMBODIMENT 2

A second embodiment of the invention will now be described with reference to the accompanying drawing.

Figure 7:
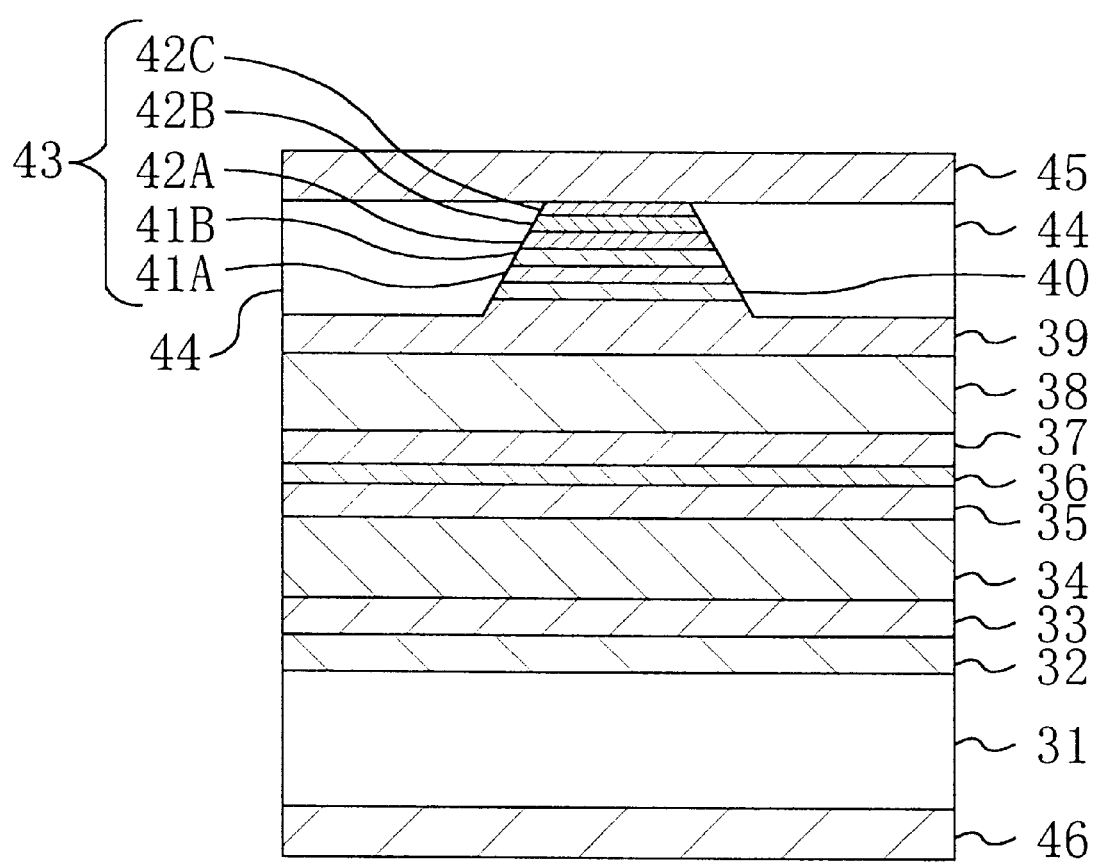
FIG. 7 is a sectional view of a semiconductor light emitting device according to a second embodiment of the invention.

FIG. 7 shows the sectional structure of a semiconductor light emitting device of the second embodiment. Now, manufacture procedures for a semiconductor laser diode 30A will be successively described with reference to FIG. 7.

First, by the MBE, on a substrate 31 of n-type GaAs with an impurity concentration of approximately $1 \times 10^{18}$ cm$^{-3}$, a first buffer layer 32 of n-type GaAs having an impurity concentration of approximately $1 \times 10^{18}$ cm$^{-3}$ and a thickness of 0.5 μm is grown. Subsequently, the substrate temperature is set at 280° C., and a second buffer layer 33 of n-type ZnSe or n-type $ZnS_{0.06}Se_{0.94}$ having a concentration of chlorine, that is, an n-type dopant, of approximately $2 \times 10^{17}$ cm$^{-3}$ and a thickness of 10 nm is grown.

Then, on the second buffer layer 33, an n-type cladding layer 34 of n-type $Zn_{0.9}Mg_{0.1}S_{0.13}Se_{0.87}$ having an impurity concentration of approximately $2 \times 10^{17}$ cm$^{-3}$ and a thickness of 600 nm, an n-type light guiding layer 35 of n-type $ZnS_{0.06}Se_{0.94}$ with a thickness of 100 nm, an active layer 36 of ZnCdSe with a thickness of 6 nm and a p-type light guiding layer 37 of p-type $ZnS_{0.06}Se_{0.94}$ with a thickness of 100 nm are successively grown. In this manner, a light emitting area including the n-type light guiding layer 35, the active layer 36 and the p-type light guiding layer 37 is formed.

Next, on the p-type light guiding layer 37, a p-type cladding layer 38 of p-type $Zn_{0.9}Mg_{0.1}S_{0.13}Se_{0.87}$ having a nitrogen impurity concentration of approximately $1 \times 10^{17}$ cm$^{-3}$ and a thickness of 600 nm, a first barrier relieving layer 39 of p-type $ZnS_{0.06}Se$ having an impurity concentration of approximately $5 \times 10^{17}$ cm$^{-3}$ and a thickness of 300 nm and a second barrier relieving layer 40 of p-type ZnSe having an impurity concentration of approximately $5 \times 10^{17}$ cm$^{-3}$ and a thickness of 20 nm are successively grown.

Subsequently, on the second barrier relieving layer 40, a p-type contact structure 43 which is a characteristic of this embodiment is formed. The p-type contact structure 43 includes, for example, a first layer 41A of p-type $ZnS_{0.31}Se_{0.54}Te_{0.15}$ with a thickness of 10 nm and a second layer 41B of $ZnS_{0.47}Se_{0.28}Te_{0.25}$ with a thickness of 10 nm together serving as a first contact layer, a third layer 42A of p-type $ZnS_{0.65}Te_{0.35}$ with a thickness of 10 nm and a fourth layer 42B of p-type $ZnS_{0.5}Te_{0.5}$ with a thickness of 5 nm together serving as a second contact layer, and a fifth layer 42C of p-type ZnTe with a thickness of 5 nm, which are successively formed in this order from the surface closer to the substrate 31.

Accordingly, since the p-type contact structure 43 has such a five-layer structure of ZnSSeTe, ZnSTe and ZnTe, the energy difference in the valence band between the adjacent alloyed crystal layers can be suppressed to approximately 0.2 eV or less as described in the first embodiment. As a result, the operating voltage of the semiconductor laser diode 30A can be remarkably decreased.

At this point, the first barrier relieving layer 39 of p-type $ZnS_{0.06}Se_{0.94}$ and the second barrier leasing layer 40 of p-type ZnSe successively formed on the surface closer to the substrate 31 are sandwiched between the p-type cladding layer 38 and the p-type contact structure 43. Therefore, the potential barrier formed on the interface between the p-type cladding layer 38 and the p-type contact structure 43 can be definitely reduced.

Subsequently, a mesa stripe area with a depth of 0.3 μm and a stripe width of 10 μm is formed so that the crystal orientation accords with the (011) orientation on the top surface of the epitaxial layers formed on the substrate 31. Then, by using an insulating layer 44 of ZnS, portions at both sides of the mesa stripe area on the first barrier relieving layer 39 are buried.

Then, a positive metal electrode 45 of Au/Pd is formed on the p-type contact structure 43 and a negative metal electrode 46 of AuGeNi or the like is formed on the back surface of the substrate 11 through the vacuum evaporation.

Next, the substrate 31 is cleaved so as to attain a length of a resonator of 750 μm, thereby cutting out a laser chip. Then, so-called cleaved edge coating is conducted. Specifically, the respective cleaved edges are coated with stacked films including plural layers of $TiO_x$ and $SiO_2$, so as to attain reflectance of 70% and 95% at the output edge face and the reflection edge face of the resonator, respectively. Thus, the semiconductor laser diode 30A of FIG. 7 is obtained.

The semiconductor laser diode 30A manufactured as described above is continuously operated at room temperature, so as to measure the current-voltage characteristic and the light outputting characteristic thereof.

Also, for comparison, the characteristics of a laser device having the same laser structure but including the conventional pseudo-graded superlattice structure of ZnSe/ZnTe are similarly measured.

The semiconductor laser diode 30A of this embodiment is lased at a wavelength of 512 nm, a threshold current for laser action is approximately 42 mA, and the operating voltage at the threshold current is satisfactorily approximately 5 V. On the other hand, the conventional laser diode is also lased at a wavelength of 512 nm, and a threshold current for laser action is approximately 44 mA, but the operating voltage at the threshold current is as high as approximately 18 V.

In this manner, the p-type contact structure 43 of this embodiment can decrease the operating voltage of a laser diode to be smaller than approximately 1/3 of the conventional operating voltage.

Moreover, while the operating voltage of the conventional laser diode is increased through current injection, the low operating voltage is stably retained through the current injection in the laser diode 30A of this embodiment.

In addition, when the semiconductor laser diode 30A of this embodiment is mounted and driven on a heat sink, it is confirmed that the laser diode can be stably operated with high output power of 30 mW or more.

EMBODIMENT 3

A third embodiment of the invention will now be described with reference to the accompanying drawing.

Figure 8:
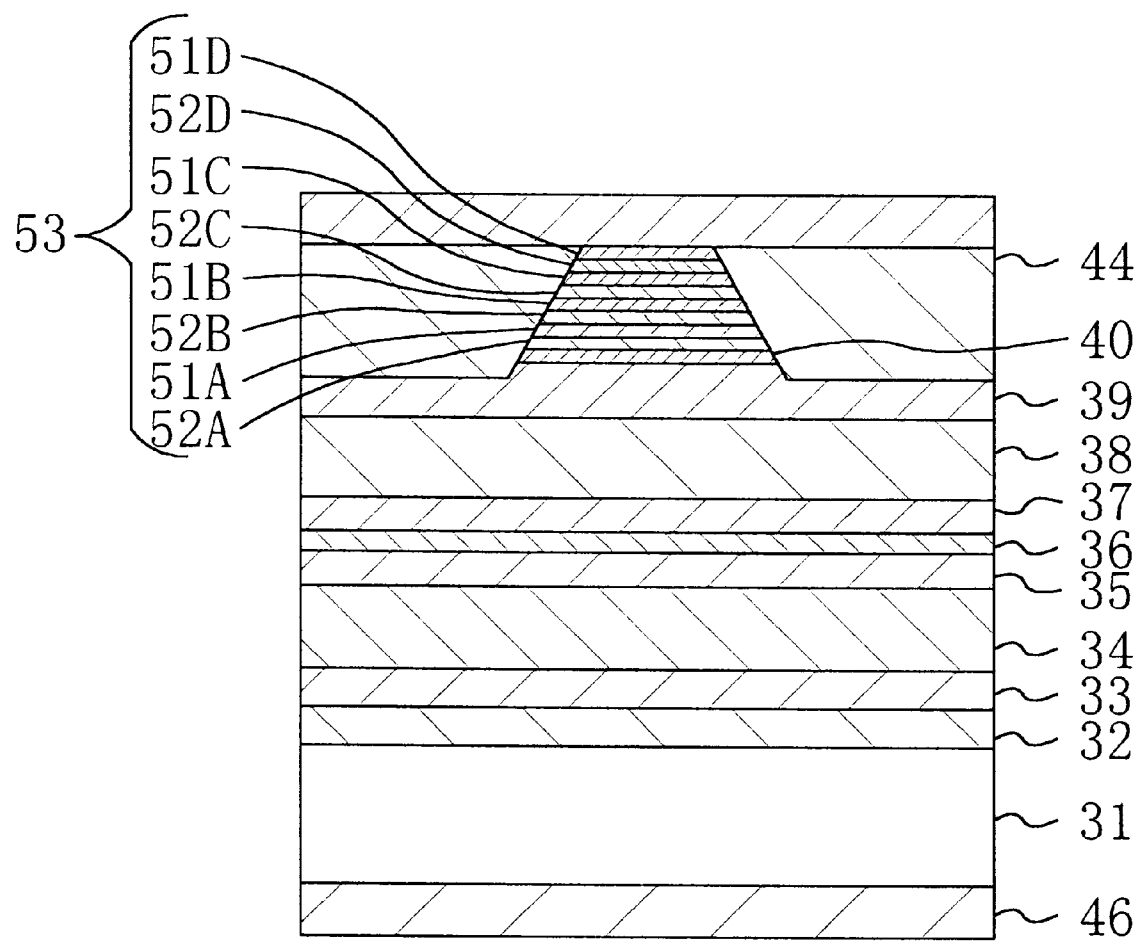
FIG. 8 is a sectional view of a semiconductor light emitting device according to a third embodiment of the invention.

FIG. 8 shows the sectional structure of a semiconductor light emitting device of the third embodiment. In FIG. 8, like reference numerals are used to refer to like elements shown in FIG. 7 and the description is omitted. A semiconductor laser diode 30B of this embodiment includes a p-type contact structure 53 formed on the second barrier relieving layer 40 of p-type ZnSe.

The p-type contact structure 53 includes, for example, a first layer 51A of p-type $ZnS_{0.31}Se_{0.54}Te_{0.15}$ and a second layer 51B of p-type $ZnS_{0.47}Se_{0.28}Te_{0.25}$ together serving as a first contact layer, a third layer 51C serving as a second contact layer of p-type $ZnS_{0.65}Te_{0.35}$ and a fourth layer 51D of p-type ZnTe, each having a thickness of 5 nm, formed successively in this order from the surface closer to the substrate 31.

Furthermore, the p-type contact structure 53 includes, between the aforementioned four layers including between the second barrier relieving layer 40 and the first layer 51A of the p-type contact structure 53, a first graded composition layer 52A, a second graded composition layer 52B, a third graded composition layer 52C and a fourth graded composition layer 52D, each with a thickness of 10 nm, formed successively in this order from the surface closer to the substrate 31. At this point, the respective graded composition layers 52A through 52D are doped with nitrogen, and the compositions at the uppermost and lowermost portions of each graded composition layer close to the interfaces substantially accord with the compositions of the layers adjacent with the interfaces sandwiched.

As a result, the energy difference in the valence band between the adjacent layers can be suppressed to approximately 0.2 eV or less. Owing to the respective graded composition layers 52A through 52D interposed between the adjacent layers of the p-type contact structure 53, the valence band offset can be thus further reduced.

The semiconductor laser diode 30B including the p-type contact structure 53 of this embodiment is lased at a wavelength of 511 nm, a threshold current is approximately 43 mA, and the operating voltage at the threshold current is satisfactorily approximately 4 V. In comparison, a laser diode having a conventional contact structure is lased at a wavelength of 511 nm, and a threshold current is approximately 47 mA, but the operating voltage at the threshold current is as high as approximately 19 V.

In this manner, the p-type contact structure 53 of this embodiment can decrease the operating voltage of a laser diode to be smaller than approximately 1/5 of that of the conventional device.

Also, the operating voltage of the conventional semiconductor laser diode is increased through current injection, but the low operating voltage of the semiconductor laser diode 30B of this embodiment is not increased but can be stably retained through the current injection.

EMBODIMENT 4

A fourth embodiment according to the invention will now be described.

In the first embodiment, the stacked substance of ZnSSeTe and ZnSTe is used as a material for reducing the potential barrier formed between the p-type group II-VI compound semiconductor and the metal electrode. In this embodiment, a BeZnSeTe alloyed crystal is used for this purpose, so as to obtain a contact structure which has a good current-voltage characteristic, includes few defects derived from the lattice mismatch and can be easily formed.

The usage of a pseudo-graded superlattice structure of BeTe and ZnSe as a contact layer has been conventionally proposed (Appl. Phys. Lett. 64(16), 1994, pp. 2148–2150). In this structure, the lattice mismatch can be made smaller than in the pseudo-graded superlattice structure of ZnSe/ZnTe, but the crystal growth is complicated because it is necessary to control the film thicknesses in an atomic layer order by repeating the epitaxial growth of a short period of time. Therefore, it is difficult to obtain a high quality contact structure at high reproducibility.

Since the BeZnSeTe alloyed crystal is used in this embodiment, the valence band level can be varied in a wide range while retaining the lattice match with a semiconductor substrate in a wide range. In particular, in attaining the lattice match between the BeZnSeTe alloyed crystal and a substrate of GaAs, the valence band level of BeZnSeTe can be varied from an energy level continuous with that of p-type ZnSe to an energy level close to the Fermi level of a metal such as Au. Also, the BeZnSeTe alloyed crystal can be doped with a p-type dopant at a concentration sufficiently high as a contact layer.

Specifically, since the BeZnSeTe alloyed crystal is used in a contact structure, the potential barrier derived from the band discontinuity between ZnSe and ZnTe or between ZnSe and a metal electrode can be reduced in the contact structure, which has so small lattice mismatch that it can substantially matches with a semiconductor substrate.

Moreover, since the resistance increase of the semiconductor layers due to nitrogen diffusion can be suppressed by using the BeZnSeTe alloyed crystal, it is possible to obtain a semiconductor device including a group II-VI compound semiconductor having a low operating voltage and high reliability, which cannot be obtained by the conventional technique.

In this embodiment, a p-type BeZnSeTe layer is disposed on a p-type group II-VI compound semiconductor formed on a substrate of GaAs or ZnSe. As a result, the contact structure having a very small lattice mismatch with the substrate and a small potential barrier can be realized.

Also, a p-type ZnSe layer is preferably formed on an interface between the p-type group II-VI compound semiconductor and the p-type BeZnSeTe layer because the valence band offset on the interface can be thus decreased, resulting in reducing the potential barrier.

Furthermore, the p-type BeZnSeTe layer preferably includes at least two layers having different compositions because the valence band offset between the adjacent semiconductor layers can be thus decreased, resulting in reducing the potential barrier.

Moreover, the p-type BeZnSeTe layer preferably has a continuously varied composition because the potential barrier derived from the valence band offset between the semiconductor layers can be thus reduced.

Furthermore, in the multilayer film of p-type BeZnSeTe or the film whose composition is continuously varied (i.e., a graded composition film), the valence band level is preferably changed in a stepwise manner or continuously from an energy level close to that of a p-type group II-VI compound semiconductor, such as ZnSe and $ZnS_{0.06}Se_{0.94}$, to an energy level close to the Fermi level of a metal electrode of Au or the like. In this manner, the potential barrier derived from the valence band offset between the group II-VI compound semiconductor and the metal electrode can be effectively reduced.

Also, the p-type BeZnSeTe layer preferably has a composition with a lattice constant substantially the same as that of the substrate where the p-type group II-VI compound semiconductor is grown because a high quality contact structure with few lattice defects can be thus obtained. For example, when a GaAs substrate is used, the lattice constant approximate to that of the substrate can be attained by setting, in $Be_yZn_{1-y}Se_{1-z}Te_z$ (wherein $0<y\leq 1$ and $0\leq z<1$), the composition ratios y and z at substantially the same values.

Preferably, between the p-type contact structure and the metal electrode, a p-type ZnTe layer or a p-type BeTe layer directly in contact with the metal electrode is disposed. Furthermore, an alloyed crystal layer such as a p-type ZnSTe layer, a p-type ZnSeTe layer, a p-type ZnSSeTe layer or a p-type BeZnTe layer can be disposed therebetween. In any of these alloyed crystal layers, the valence band level can be changed to be close to the Fermi level of a metal and the alloyed crystal can be doped to attain a high acceptor density. Therefore, an ohmic electrode with a low resistance against the metal electrode can be formed. Among these alloyed crystal layers, the p-type ZnTe layer and the p-type BeTe layer have a small potential barrier against the metal electrode, and hence can easily provide a contact structure with a low resistance. However, since there is a lattice mismatch between ZnTe and GaAs, when ZnTe is used, the film thickness should be 2 nm through 30 nm so as to suppress the occurrence of the crystal defects.

As compared with the contact structure of ZnSSeTe and ZnSTe according to the first embodiment, in the contact structure of p-type BeZnSeTe according to this embodiment, the valence band level can be varied in a wider range with the lattice match retaining a wide range and the composition can be more easily controlled with retaining the lattice match. However, since a source including Be is used in crystal growth for forming the contact structure of the fourth embodiment, it is necessary to maintain the safety during the manufacture.

On the other hand, the p-type contact structure of the first embodiment has a larger bandgap width than the p-type contact structure of the fourth embodiment at the same valence band level, and hence is advantageous in decreasing a loss due to the light absorption in a light emitting device. Accordingly, the p-type contact structure of the first embodiment can further improve the light emitting efficiency of a light emitting diode and a surface emitting laser diode.

It is noted that a contact structure obtained by stacking the p-type contact structure of the first embodiment and the p-type contact structure of the fourth embodiment can exhibit the same effects.

Now, the group II-VI compound semiconductor of the fourth embodiment will be described.

Figure 9:
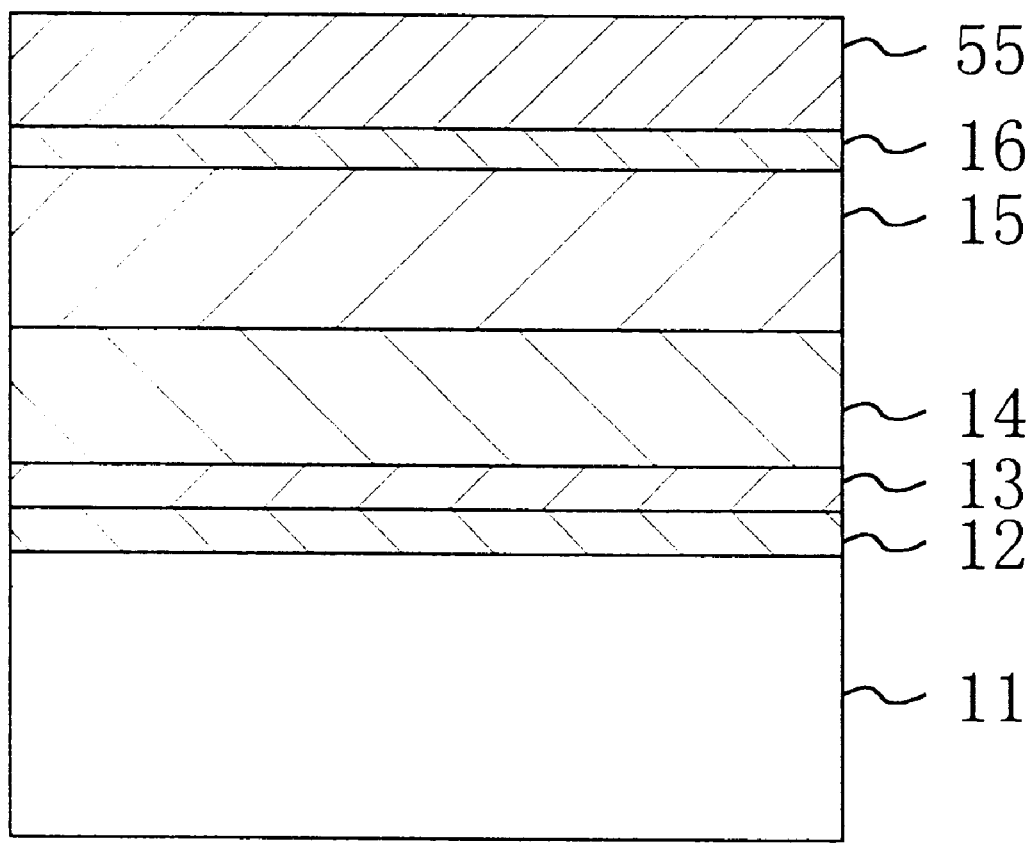
FIG. 9 is a sectional view of a group II-VI compound semiconductor according to a fourth embodiment of the invention.

FIG. 9 shows the sectional structure of the group II-VI compound semiconductor of this embodiment. In FIG. 9, like reference numerals are used to refer to like elements shown in FIG. 3, and the description is omitted. As is shown in FIG. 9, on the second p-type layer 16 of p-type ZnSe, a p-type contact structure 55 of, for example, a p-type $Be_yZn_{1-y}Se_{1-z}Te_z$ (wherein $0<y\leq 1$, $0\leq z\leq 1$ and y=z) alloyed crystal with a thickness of 100 nm having a graded composition is formed. The composition ratios y and z in the p-type contact structure 55 are continuously increased with retaining the relationship of y=z from the lower surface to the upper surface so as to be substantially 0 on the interface in contact with the second p-type layer 16 and be substantially 1 in the vicinity of the upper surface. At this point, the occurrence of the lattice defects can be prevented by suppressing a difference between the composition ratios y and z to be ±0.05 or less.

Owing to such a composition distribution, the valence band level can be continuously changed from an energy level of ZnSe to an energy level of BeTe. Therefore, the valence band offset between ZnSe and BeTe can be reduced, so as to decrease the operating voltage. Also, since the p-type contact structure 55 is formed out of the quaternary alloyed crystal of BeZnSeTe, the p-type contact structure 55 can be improved in its crystal hardness and can be more resistant against the occurrence of the crystal defects.

Moreover, the resistance increase of the alloyed crystal layers derived from the diffusion of nitrogen can be suppressed in the p-type contact structure 55 as compared with that in the conventional contact structure probably for the following reason: Since the p-type contact structure 55 has good crystallinity, the density of inactive nitrogen is small within the p-type contact structure 55 and there are few lattice defects for accelerating the diffusion. Therefore, the diffusion of inactive nitrogen can be suppressed.

In this embodiment, the p-type contact structure 55 with the graded composition has a thickness of 100 nm. However, when it has a thickness of 50 nm through 500 nm, the thickness can be sufficiently controlled by the MBE or the MOVPE, and hence, the contact structure can be formed in good uniformity.

Furthermore, a p-type BeTe layer with a thickness of 10 nm can be additionally provided on the p-type contact structure 55. The doping efficiency of BeTe is so high that a high acceptor density can be thus easily attained. The composition in the uppermost portion of the p-type contact structure 55 is substantially identical to BeTe, but such a portion actually has a very small thickness. Therefore, by providing the BeTe layer with a comparatively large thickness, the potential barrier with the metal can be reduced. Also, there is a small lattice mismatch of approximately 0.5% between the substrate 11 and BeTe, and hence, good crystallinity can be attained even when the thickness is comparatively large.

In this embodiment, the p-type contact structure 55 has the graded composition. However, when the p-type contact structure 55 is formed in a multilayer structure including definite interfaces therein, the crystal growth can be more easily controlled and the reproducibility can be further improved. In adopting the multilayer structure including definite interfaces, the p-type contact structure 55 preferably includes at least two p-type BeZnSeTe alloyed crystal layers having different compositions. In order to more effectively reduce the potential barrier, the p-type contact structure 55 is more preferably formed as a stacked substance including three or more layers having different compositions.

For example, the p-type contact structure 55 can be formed as a stacked substance including a first layer of p-type $Be_{0.1}Zn_{0.9}Se_{0.9}Te_{0.1}$, a second layer of p-type $Be_{0.2}Zn_{0.8}Se_{0.8}Te_{0.2}$, a third layer of p-type $Be_{0.5}Zn_{0.5}Se_{0.5}Te_{0.5}$, a fourth layer of p-type $Be_{0.7}Zn_{0.3}Se_{0.3}Te_{0.7}$, and a fifth layer of p-type BeTe, each having a thickness of 10 nm, formed in this order on the second p-type layer 16.

In this manner, the energy difference in the valence band between the adjacent alloyed crystal layers can be suppressed to be 0.3 eV or less, and therefore, the operating voltage can be decreased. Since the respective alloyed crystal layers substantially match in the lattice size with the substrate of GaAs or ZnSe, and hence, the crystal defects can be reduced.

Also, when the stacked substance matches with the substrate in the lattice size, each layer of the stacked substance can be grown in a thickness of 2 nm through 300 nm, so that the plane uniformity can be controlled to be further improved during the crystal growth. When each of the alloyed crystal layers has a thickness of 5 nm through 100 nm, the growth time can be comparatively short, and the crystal can be grown with high plane uniformity and high controllability.

Furthermore, when the p-type contact layer 55 is formed as the stacked substance of the multilayer film, the interfaces between the layers can be eliminated by providing an interlayer graded composition layer between each adjacent layers, and the effect of the energy barrier can be thus suppressed. At this point, the compositions in the uppermost and lowermost portions of each interlayer graded composition layer in the vicinity of the interfaces are substantially identical to those of the layers adjacent with the interfaces sandwiched.

When each interlayer graded composition layer has a thickness of 5 nm through 50 nm, the offset on the interface can be reduced and the thickness can be controlled by the MBE or the MOVPE, resulting in improving the uniformity. Also, when the interlayer graded composition layers are provided, the thickness of the layers other than the graded composition layers can be 10 nm or less.

Now, a method of manufacturing the aforementioned group II-VI compound semiconductor will be described.

First, similarly to the first embodiment, the layers from the first buffer layer 12 up to the second p-type layer 16 are grown on the substrate 11 by the MBE.

Next, in growing the p-type contact structure 55 of BeZnSeTe, which is a characteristic of this embodiment, a ZnSe compound crystal and a BeTe compound crystal are used as sources to be contained in cells. Thus, the cell temperature can be increased, and the heat response speed of the cells can be improved. As a result, the molecular beam intensity can be stabilized in a short period of time, and hence, the controllability can be improved.

In addition, the supply ratio among the group VI elements and the group II elements supplied from the respective sources can be a given ratio substantially equal to 1. Therefore, the VI/II ratio can be made substantially constant in all the semiconductor layers without special control.

The present inventors have found that a $Be_yZn_{1-y}Se_{1-z}Te_z$ alloyed crystal can be grown with retaining good crystallinity in all the semiconductor layers in a range where the composition ratios y and z are substantially equal in accordance with the supply ratio among the group VI elements and the group II elements supplied from the ZnSe and BeTe compound sources, and that the alloyed crystal can be doped with a p-type dopant at a density for decreasing the resistance.

Also, when the ZnSe compound crystal source and the BeTe compound crystal source are used, a $Be_yZn_{y-1}Se_{1-z}Te_z$ crystal where the composition ratios y and z are substantially equal, namely, having a composition substantially matching in the lattice size with the substrate 11, can be automatically formed. In addition, when a ZnTe or BeSe compound source is used, the p-type contact structure 55 with more highly accurate lattice match can be formed. However, when the contact structure has the aforementioned thickness, good crystallinity can be sufficiently attained without using an additional cell for the ZnTe or BeSe compound source.

In this manner, during the crystal growth, merely the supply ratio between the ZnSe compound source and the BeTe compound source is controlled so as to attain a desired alloyed crystal composition. Therefore, the crystal growth is very simplified and the reproducibility can be improved.

Also, according to the manufacture method of this embodiment, a semiconductor layer with a graded composition can be easily formed in good crystallinity under a satisfactory doping condition.

Figure 10:
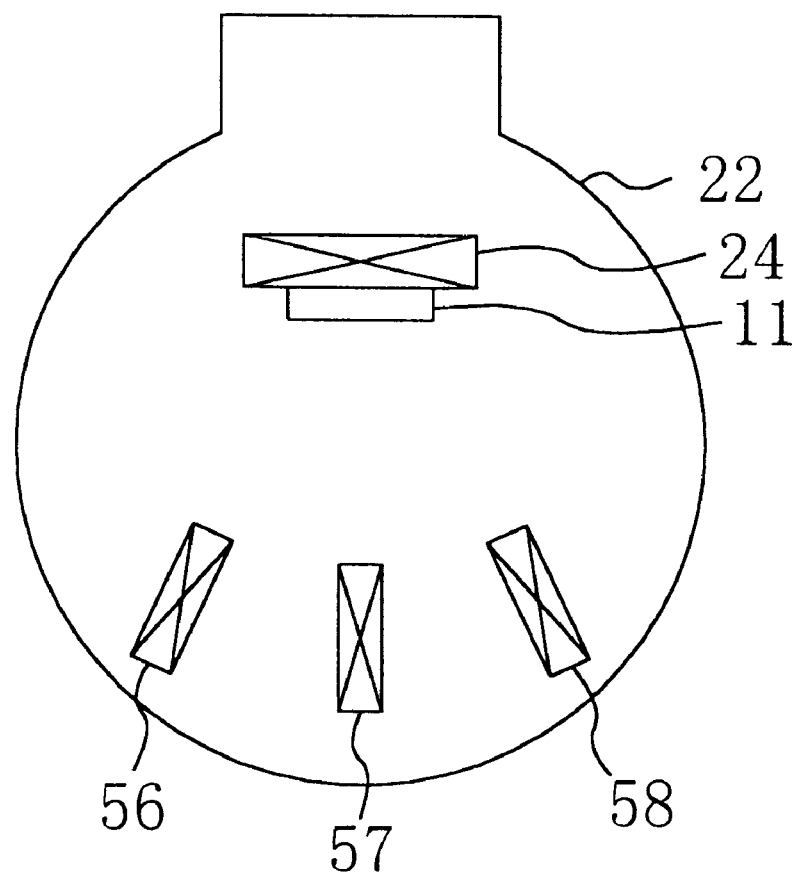
FIG. 10 is a diagram for showing the structure of an MBE system used in a method of manufacturing a semiconductor of the fourth embodiment.

FIG. 10 shows the schematic structure of an MBE system used in the method of manufacturing a semiconductor of this embodiment. In FIG. 10, like reference numerals are used to refer to like elements shown in FIG. 4, and the description is omitted.

In the vacuum chamber 22 of the MBE system 21B of this embodiment, a first K cell 56 and a second K cell 57 serving as thermal evaporation sources, each of which includes an emission portion of a corresponding molecular beam opposing the surface of the substrate 11, and a radical nitrogen gun 58 for emitting radical nitrogen used as a p-type dopant are disposed.

The first K cell 56 contains, for example, a compound source of a ZnSe crystal and the second K cell 57 contains, for example, a compound source of a BeTe crystal. Although not shown in the drawing, another K cell containing a simple metal source of Zn or Se and substrate introducing means can be provided if necessary.

The substrate 11 on which the semiconductor layers have been grown is taken out of the vacuum chamber 22 of the MBE system 21B. Then, on the p-type contact structure 55, Pd and Au are evaporated in the shape of dots in thicknesses of 10 nm and 200 nm, respectively, thereby forming a metal electrode. Subsequently, portions of the p-type contact structure 55 where the metal electrode is not formed are removed through etching.

Figure 11:
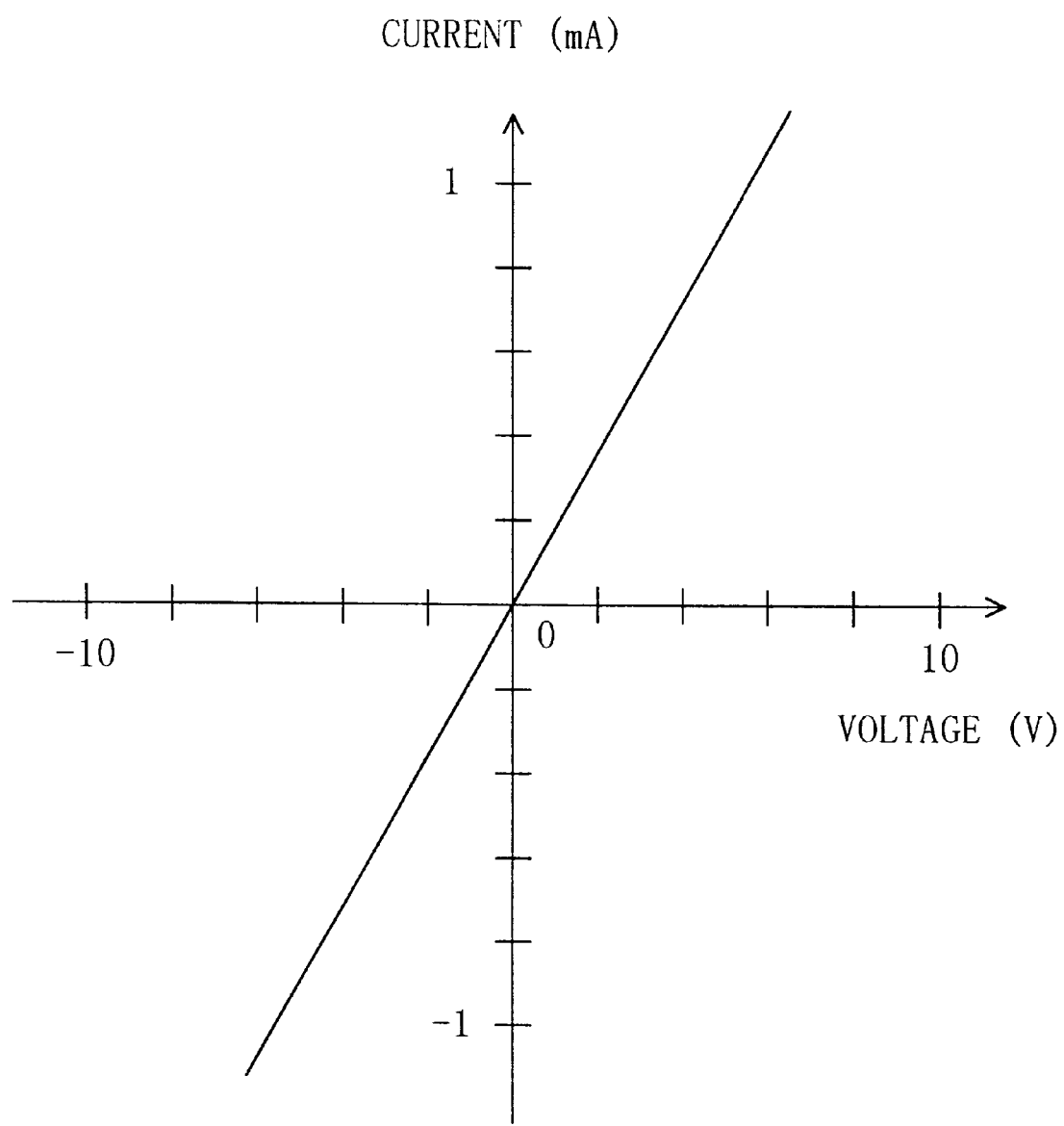
FIG. 11 is a diagram for showing a current-voltage characteristic obtained by the group II-VI compound semiconductor and a metal electrode of the fourth embodiment.

FIG. 11 shows the I-V characteristic of the metal electrode thus formed in the semiconductor layer. As is shown in FIG. 11, the resistance is as low as 5.4 K$\Omega$, and the I-V characteristic has a linear property passing through the origin. This reveals that a good ohmic electrode has been realized. Also, the adhesion and uniformity between the metal electrode and the p-type contact structure 55 are high, and the surface is plane and mechanically stable, on which wiring such as wire bonding can be easily conducted.

Moreover, few lattice defects are found in the p-type contact structure 55, the electric characteristic is stable, and the reproducibility and the reliability are high. Furthermore, the electric characteristic is not largely affected through a heat treatment at a temperature up to approximately 250° C. and can be stable even through the current injection.

As described so far, by adopting the p-type contact structure 55 of this embodiment, a good ohmic property, high reproducibility and high reliability can be definitely achieved.

EMBODIMENT 5

A fifth embodiment of the invention will now be described with reference to the accompanying drawing.

Figure 12:
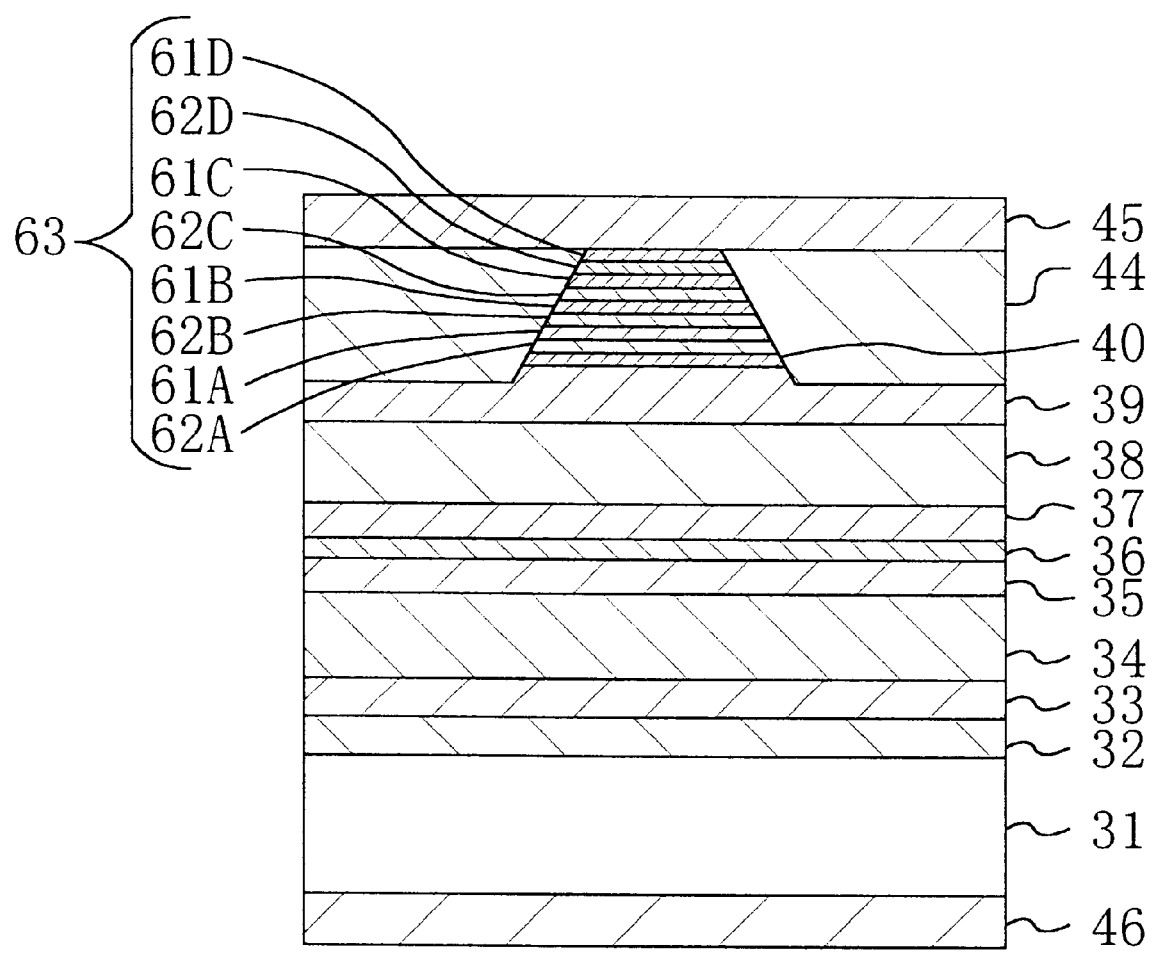
FIG. 12 is a sectional view of a semiconductor light emitting device according to a fifth embodiment of the invention.

FIG. 12 shows the sectional structure of a semiconductor light emitting device according to the fifth embodiment. In FIG. 12, like reference numerals are used to refer to like elements shown in FIG. 8, and the description is omitted. The semiconductor laser diode 30C of this embodiment includes a p-type contact structure 63 formed on the second barrier releaving layer 40 of p-type ZnSe.

The p-type contact structure 63 includes, for example, a first layer 61A of p-type $Be_{0.2}Zn_{0.8}Se_{0.8}Te_{0.2}$, a second layer 61B of p-type $Be_{0.5}Zn_{0.5}Se_{0.5}Te_{0.5}$, a third layer 61C of p-type $Be_{0.7}Zn_{0.3}Se_{0.3}Te_{0.7}$, and a fourth layer 61D of p-type BeTe, each having a thickness of 5 nm, formed in this order from the surface closer to the substrate 31.

Furthermore, the p-type contact structure 63 includes, between the aforementioned four layers including between the second barrier releaving layer 40 and the first layer 61A of the p-type contact structure 63, a first graded composition layer 62A, a second graded composition layer 62B, a third graded composition layer 62C and a fourth graded composition layer 62D, each having a thickness of 10 nm. In this case, the respective graded composition layers 62A through 62D are doped with nitrogen, so that the compositions in the uppermost and lowermost portions of each graded composition layer can accord with those of the layers adjacent with the interfaces sandwiched.

In this manner, the energy difference in the valence band between the adjacent layers can be suppressed to approximately 0.2 eV or less. Since the p-type contact structure 63 thus includes the graded composition layers 62A through 62D between the respective layers, the valence band offset can be further reduced.

The semiconductor laser diode 30C including the p-type contact structure 63 of this embodiment is lased at a wavelength of 515 nm, a threshold current is approximately 48 mA, and the operating voltage at this threshold current is as low as approximately 4 V. Although a laser device including the conventional contact structure is lased at a wavelength of 515 nm and a threshold current is approximately 50 mA, the operating voltage at this threshold current is as high as approximately 17 V.

Thus, according to this embodiment, the operating voltage of a laser device can be decreased to be approximately ¼ or less than that of the conventional laser device.

Furthermore, while the operating voltage of the conventional semiconductor laser diode is increased through the current injection, the operating voltage of the semiconductor laser diode 30C of this embodiment can be stably retained without increasing through the current injection.

EMBODIMENT 6

A sixth embodiment of the invention will now be described with reference to the accompanying drawing.

Figure 13:
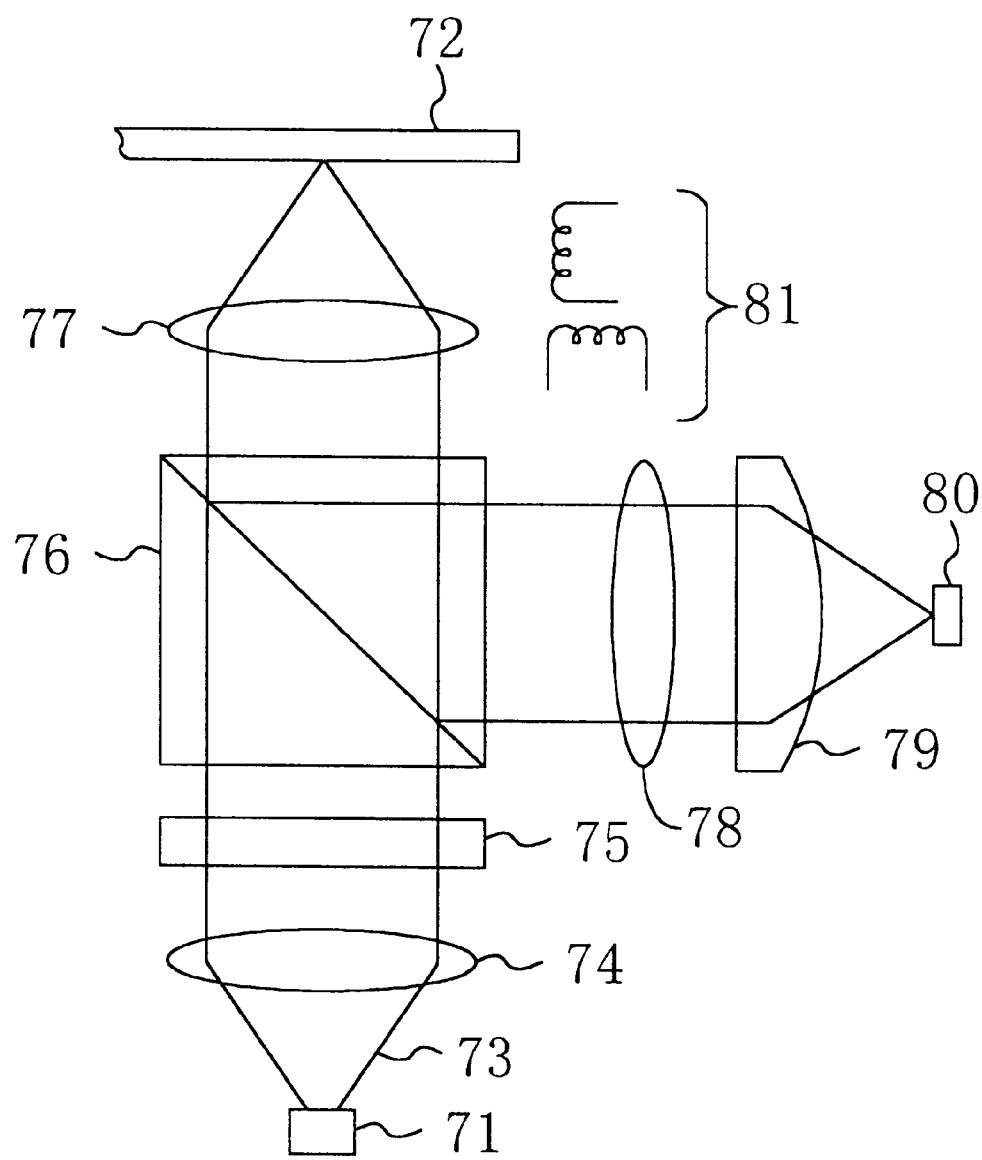
FIG. 13 is a diagram for showing the structure of an optical disk unit according to a sixth embodiment of the invention.

FIG. 13 shows the structure of an optical disk unit according to the sixth embodiment. As is shown in FIG. 13, the optical disk unit 70 includes a semiconductor laser apparatus 71. The semiconductor laser apparatus 71 includes a semiconductor laser diode according to any of the second, third and fifth embodiments of the invention which outputs a laser beam with a wavelength of 510 nm and is mounted in a can.

The laser outputting face of the semiconductor laser apparatus 71 opposes the recording surface of an optical disk 72, and a laser beam 73 emitted from the semiconductor laser apparatus 71 is collimated by a collimator lens 74. The collimated laser beam 73 is divided into three beams (not shown) by a diffraction grating 75, passes through a half prism 76 and is collected by a collective lens 77, thereby forming a spot with a diameter of 700 nm on the recording surface of the optical disk 72. Light reflected by the recording surface of the optical disk 72 passes through the collective lens 77 again, is reflected by the half prism 76, is diaphragmed by a light receiving lens 78, permeates through a cylindrical lens 79 and enters a photodiode 80, where the light is converted into an electric signal. At this point, the positional shift in the radial direction of the optical disk 72 is detected by using the divided three beams, and the positional shift of the focal point is detected by using the cylindrical lens 79. A positional shift thus detected is corrected through fine adjustment of the respective optical systems by a driving system 81.

Such an optical disk unit 70 is required of very high reliability in the semiconductor laser diode for the following reason: In this optical disk unit 70, the positional shift in the radial direction of the optical disk 72 and the positional shift of the focal point are detected for feedback control on the basis of the laser beam 73 emitted from the semiconductor laser diode 71. Therefore, the unit cannot be stably operated when the characteristic of the semiconductor laser diode working as a light source is even slightly varied.

In the conventional group II-VI compound semiconductor laser diode, the device characteristic is varied with time, which can make the operation unstable. As a result, the reliability of the entire optical disk unit including the device is disadvantageously spoiled.

When the group II-VI compound semiconductor laser diode of this invention is used, the reliability of the device can be improved and the device characteristic is stable. Accordingly, an optical disk can be read (reproduced) in the high density with high reliability.

Furthermore, in the optical disk unit 70 of this embodiment, a driving system, including the driving system 81 and the photodiode 80, is controlled by amplifying or modulating the output of the photodiode 80, and a signal processing system for generating an output signal is driven by a single power supply of 5 V.

When the conventional group II-VI compound semiconductor laser diode is used, a voltage required for driving the laser diode is as high as 10 V or more, and hence, it is necessary to provide an independent power supply dedicated to the laser diode. Accordingly, the entire optical disk unit cannot be driven by a single power supply, resulting in disadvantageously increasing the unit size, power consumption and manufacture cost.

In contrast, since the operating voltage of the group II-VI compound semiconductor laser diode of this embodiment is as small as 5 V or less, there is no need to provide a dedicated power supply in the optical disk unit 70. As a result, the entire unit can be driven by the single power supply, and hence, the structure can be simplified. Thus, a compact optical disk unit with small power consumption can be realized.

As described so far, by applying the group II-VI compound semiconductor laser diode to an optical disk unit including a collective optical system and a photodetector, the reliability in reproducing an optical disk in the high density can be improved. In addition, since the unit can be constructed in a simple structure owing to the single power supply, the entire optical disk unit can be decreased in size and cost.

Furthermore, the group II-VI compound semiconductor laser diode of this invention can attain high output power of 15 mW or more. Accordingly, the semiconductor laser diode can be used also in a writing (recording) operation on an optical disk. Therefore, the invention is applicable to an optical disk unit with a simple structure and an excellent electric characteristic in which one laser diode is used for both reading and writing.

The semiconductor laser diode 71 of a canned type in which a laser diode is contained in a can is used in this embodiment, which does not limit the invention. The optical disk unit 70 of this invention can be further decreased in its size by placing the laser diode on a silicon substrate and integrating the laser diode, the photodiode 80 for light signal detection and a micro mirror for reflecting the laser beam 73 from the laser diode.

EMBODIMENT 7

A seventh embodiment of the invention will now be described with reference to the accompanying drawing.

A semiconductor device using a group II-VI compound semiconductor is useful not only as a semiconductor light emitting device but also as a semiconductor light receiving device or more widely, as an electronic device. In particular, owing to its large bandgap width, a group II-VI compound semiconductor is applicable, as an electronic device, to a high voltage device, a high power device or a high speed operation device.

Figure 14:
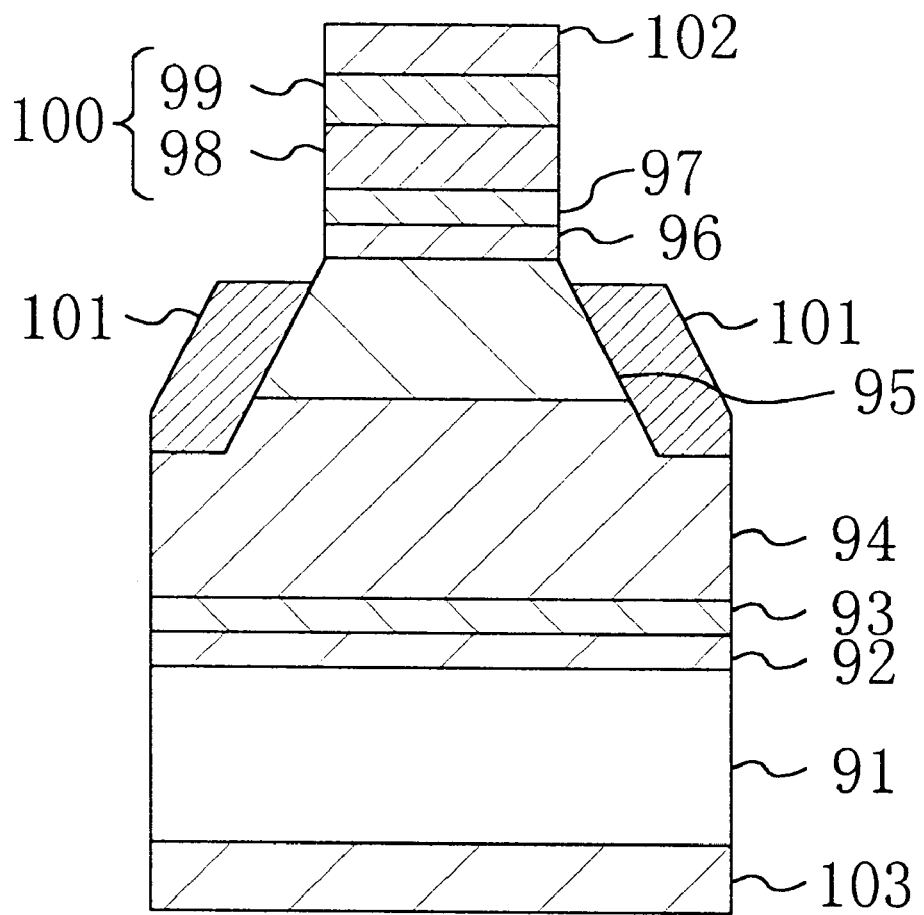
FIG. 14 is a sectional view of a pn junction diode according to a seventh embodiment of the invention.

FIG. 14 shows the sectional structure of a pn junction diode, which is one of electronic devices according to the seventh embodiment. Herein, manufacture procedures for the pn junction diode 90 will be successively described with reference to FIG. 14.

First, on a substrate 91 of n-type GaAs with an impurity concentration of approximately $1 \times 10^{18}$ cm$^{-3}$, a first buffer layer 92 of n-type GaAs having an impurity concentration of approximately $1 \times 10^{18}$ cm$^{-3}$ and a thickness of 0.5 μm is grown by the MBE. Thereafter, the substrate temperature is set at 280° C., a second buffer layer 93 of n-type ZnSe having a concentration of chlorine, that is, an n-type dopant, of $2 \times 10^{17}$ cm$^{-3}$ and a thickness of 10 nm is grown.

Subsequently, on the second buffer layer 93, an n-type layer 94 of n-type $ZnS_{0.06}Se_{0.94}$ having a chlorine impurity concentration of approximately $2 \times 10^{17}$ cm$^{-1}$ and a p-type layer 95 of p-type $ZnS_{0.06}Se_{0.94}$ having a nitrogen impurity concentration of approximately $1 \times 10^{17}$ cm$^{-3}$ are successively grown. In this manner, a pn junction including the n-type layer 94 and the p-type layer 95 is formed.

Next, on the p-type layer 95, a first barrier releaving layer 96 of p-type $ZnS_{0.06}Se_{0.94}$ having an impurity concentration of approximately $5 \times 10^{17}$ cm$^{-3}$ and a thickness of 300 nm and a second barrier releaving layer 97 of p-type ZnSe having an impurity concentration of approximately $5 \times 10^{17}$ cm$^{-3}$ and a thickness of 20 nm are successively grown.

Then, on the second barrier releaving layer 97, a p-type contact structure 100, which is a characteristic of this embodiment, is formed. The p-type contact structure 100 includes, for example, a first layer 98, serving as a first contact layer, of p-type $ZnS_wSe_{1-w-x}Te_x$ (wherein 0<w<1, 0<x<1 and w+x<1) having a graded composition with a thickness of 100 nm, and a second layer 99, serving as a second contact layer, of p-type $ZnS_{1-y}Te_y$ (wherein $0.3 < y \leq 1$) having a graded composition with a thickness of 50 nm, successively formed from the surface closer to the substrate 91.

In the composition of the first layer 98, the composition ratio w is approximately 0.06 and the composition ratio x is substantially 0 on the interface in contact with the second barrier releaving layer 97, so that the composition ratios w and x can be continuously increased toward the upper portion thereof to reach substantially 0.65 and 0.35, respectively in the uppermost portion thereof. In the composition of the second layer 99, the composition ratio y is approximately 0.35 on the interface in contact with the first layer 98, so that the composition ratio y can be continuously increased toward the upper portion thereof to reach substantially 1 in the uppermost portion thereof.

Next, the epitaxial layers grown on the substrate 91 are etched, thereby forming a mesa part, and portions on both sides of the p-type layer 95 in the mesa part are buried with an insulating layer 101 of ZnS. Subsequently, a positive metal electrode 102 of Au/Pd is formed on the p-type contact structure 100 and a negative metal electrode 103 of AuGeNi or the like is formed on the back surface of the substrate 91 through the vacuum evaporation.

A current-voltage characteristic of the pn junction diode 90 manufactured as described above is measured. It is confirmed that the characteristic exhibits an obvious rectification property and is stable with little variation for a long period of time.

In this manner, in the p-type contact structure 100 of this embodiment, the valence band level is continuously varied owing to the aforementioned composition distribution. Therefore, the valence band offset between the second barrier releaving layer 97 of ZnSe and the positive metal electrode 102 can be reduced. As a result, the operating voltage can be decreased.

Also, in the p-type contact structure 100, the lattice mismatch with the substrate 91 can be reduced due to the graded composition of the first layer 98, and hence, a contact of a high quality crystal including few crystal defects can be realized.

The pn junction diode 90 is herein described as merely an example of the electronic devices. The present invention is applicable to a bipolar transistor device or a field effect transistor device, or also to an IC or an LSI including integration of such transistor devices.

EMBODIMENT 8

An eighth embodiment of the invention will now be described with reference to the accompanying drawings.

Figure 15:
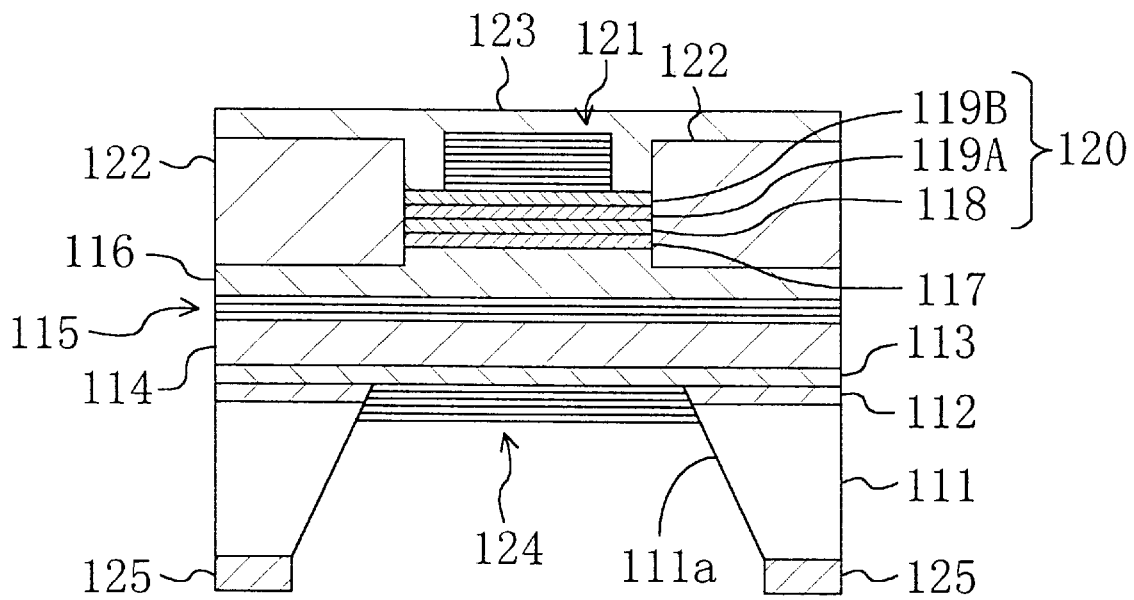
FIG. 15 is a sectional view of a vertical cavity surface emitting laser diode according to an eighth embodiment of the invention.

FIG. 15 illustrates the sectional structure of a vertical cavity surface emitting laser diode according to the eighth embodiment.

Now, manufacture procedures for the vertical cavity surface emitting laser diode 110 will be successively described with reference to FIG. 15.

First, on a substrate 111 of n-type GaAs having an impurity concentration of approximately $1 \times 10^{18}$ cm$^{-3}$, a first buffer layer 112 of n-type GaAs having an impurity concentration of approximately $1 \times 10^{18}$ cm$^{-3}$ and a thickness of 0.5 μm is grown by the MBE. Then, the substrate temperature is set at 280° C., and a second buffer layer 113 of n-type ZnSe or n-type $ZnS_{0.06}Se_{0.94}$ having an impurity concentration of approximately $2 \times 10^{17}$ cm$^{-3}$ and a thickness of 10 nm is grown.

Next, on the second buffer layer 113, an n-type cladding layer 114 of n-type $Zn_{0.9}Mg_{0.1}S_{0.13}Se_{0.87}$ having an impurity concentration of approximately $2 \times 10^{17}$ cm$^{-3}$ and a thickness of 600 nm, a multi-quantum well active layer 115 of a multilayer of ZnCdSe/ZnSe with a thickness of 10 nm, and a p-type cladding layer 116 of p-type $Zn_{0.9}Mg_{0.1}S_{0.13}Se_{0.87}$ having an impurity concentration of approximately $1\times10^{17}$ cm$^{-3}$ and a thickness of 600 nm are successively grown. In this manner, a light emitting area including the n-type cladding layer 114, the multi-quantum well active layer 115 and the p-type cladding layer 116 is formed.

Then, on the p-type cladding layer 116, a barrier relieving layer 117 of p-type $ZnS_{0.06}Se_{0.94}$ having an impurity concentration of approximately $5\times10^{17}$ cm$^{-3}$ and a thickness of 300 nm and a p-type contact structure 120 are successively formed.

The p-type contact structure 120 includes, for example, a first layer 118 serving as a first contact layer of p-type $ZnS_{0.4}Se_{0.4}Te_{0.2}$ with a thickness of 20 nm, and a second layer 119A of p-type $ZnS_{0.65}Te_{0.35}$ with a thickness of 10 nm and a third layer 119B of p-type $ZnS_{0.5}Te_{0.5}$ with a thickness of 5 nm, together serving as a second contact layer. Thus, the energy difference in the valence band between the adjacent layers in the contact structure 120 can be suppressed to approximately 0.3 eV or less, and hence, the operating voltage can be decreased.

Next, on the contact structure 120, an upper DBR reflection mirror 121 including 8 pairs of stacked substances, each pair including $SiO_2$ and $TiO_x$ (wherein $1.5 \leq x \leq 2$), in the shape of an island with a diameter of approximately 10 µm, is selectively formed.

Subsequently, around the upper DBR reflection mirror 121 on the p-type contact structure 120, etching is conducted so as to bare the upper portion of the p-type cladding layer 116 in the shape of an island with a diameter of approximately 14 µm including the upper DBR reflection mirror 121. Then, an insulating layer 122 of ZnS is filled around the island-shaped semiconductor layers.

Then, a positive metal electrode 123 of Au/Pd is formed on the entire surface of the substrate 111. Thereafter, etching is conducted in an area on the back surface of the substrate 111 in a position corresponding to the upper DBR reflection mirror 121 until the second buffer layer 113 is bared, thereby forming an opening 111a. Then, on the bottom of the opening 111a, a lower DBR reflection mirror 124 including 4 pairs of stacked substances, each pair including $SiO_2$ and $TiO_x$, is formed.

Next, a negative metal electrode 125 of AuGeNi or the like is formed around the opening 111a on the substrate 111.

In this manner, the vertical cavity surface emitting laser diode 110 for emitting a laser beam from the surface of the lower DBR reflection mirror 124 is manufactured, in which the lasing frequency is approximately 490 nm through 550 nm depending upon the structure of the multi-quantum well active layer 115.

In this laser diode 110, a current injected from the positive metal electrode 123 is spread mainly in the p-type contact layer 120 in a direction parallel to the substrate surface, emits light within the multi-quantum well active layer 115 below the upper DBR reflection mirror 121, and flows toward the substrate 111.

In the laser diode 110 of this embodiment, differently from an edge emitting semiconductor laser diode, a current is required to be spread in the direction parallel to the substrate surface within the p-type contact structure so that a uniform current can be injected below the upper DBR reflection mirror 121.

Also, emitted light caused by the injected current is confined within a resonator formed by the upper DBR reflection mirror 121 and the lower DBR reflection mirror 124, and is lased due to optical gain in the multi-quantum well active layer 115 so as to be emitted through the opening 111a of the substrate 111. In a general edge emitting semiconductor laser diode, a p-type contact layer is formed away from an optical waveguide. However, in the surface emitting laser diode 110, since the p-type contact structure 120 is disposed within the resonator, light absorption in the p-type contact structure 120 largely affects the device efficiency.

The vertical cavity surface emitting laser diode 110 of this embodiment not only attains the effect to decrease the device voltage and improve the reliability but also exhibits the following effect, resulting in improving the device efficiency:

When the p-type contact structure 120 includes the conventional pseudo-graded superlattice structure of ZnTe or ZnSe/ZnTe, the ZnTe layer causes a loss due to the light absorption. For example, when it is assumed that the device emits green light with a wavelength of 535 nm and a photon energy of approximately 2.3 eV at the multi-quantum well active layer 115, since ZnTe has a bandgap width of approximately 2.2 eV, which is smaller than the photon energy, the ZnTe layer is opaque and its light absorption coefficient is as large as $10^4$ cm$^{-1}$ or more. As a result, even when the total thickness of the ZnTe layers is approximately 20 nm, a light absorption loss of several % to several tens % is caused every time the emitted light passes through the conventional p-type contact layer. Accordingly, in the vertical cavity surface emitting laser diode 110 having a smaller gain than an edge emitting laser diode, the device efficiency is largely degraded.

It is necessary to decrease the thickness of the ZnTe layer in order to reduce the light absorption. However, when the thickness is decreased, it is more difficult to obtain a good ohmic contact, and the current cannot be sufficiently spread in the direction parallel to the substrate surface. As a result, the current injection below the upper DBR reflection mirror 121 is made ununiform.

In contrast, since the p-type contact structure 120 of this embodiment includes the first layer 118 of p-type $ZnS_{0.4}Se_{0.4}Te_{0.2}$, the second layer 119A of p-type $ZnS_{0.65}Te_{0.35}$ and the third layer 119B of p-type $ZnS_{0.5}Te_{0.5}$, the resultant light emitting diode can attain high efficiency.

This is because, in using ZnSSeTe and ZnSTe alloyed crystals in the p-type contact structure 120, the valence band level can be varied to an energy level close to the Fermi level of a metal electrode with widely retaining the bandgap width of the semiconductor as described above.

The present inventors have confirmed that the emitted light is scarcely absorbed in the present p-type contact structure because the bandgap widths of $ZnS_{0.4}Se_{0.4}Te_{0.2}$, $ZnS_{0.65}Te_{0.35}$ and $ZnS_{0.5}Te_{0.5}$ are approximately 2.7 eV, 2.6 eV and 2.4 eV, respectively and are all larger than the photon energy of the emitted light. However, when the oscillation frequency is short, slight light absorption is caused in $ZnS_{0.5}Te_{0.5}$, which has the largest composition ratio of Te among these alloyed crystals. Still in this case, $ZnS_{0.5}Te_{0.5}$ has a larger bandgap width than ZnTe and has a thickness as small as 5 nm, and hence, the light absorption in the p-type contact structure 120 can be reduced.

In order to improve the contact between the p-type contact structure 120 and the positive metal electrode 123, a semiconductor layer having a high valence band level, namely, having a narrower bandgap width, for example, an alloyed crystal layer of ZnTe or the like, can be additionally provided on the electrode. In this case, the light absorption is caused in this alloyed crystal layer, but still, the thickness of the alloyed crystal layer can be smaller than in the conventional contact structure, and hence, the absorption loss can be minimized.

Furthermore, owing to the current diffusion effect derived from the potential barrier formed on the interface between the first layer 118 of the p-type contact structure 120 and the barrier relieving layer 117 and the small resistivity of the first layer 118, the current can be effectively spread.

In addition, since the light absorption is scarcely caused in the second layer 119A and the third layer 119B of the p-type contact structure 120, the thicknesses of the second layer 119A and the third layer 119B can be comparatively large. Therefore, the current can be more easily spread in the direction parallel to the substrate surface, resulting in uniformly injecting the current below the upper DBR reflection mirror 121.

Figure 16:
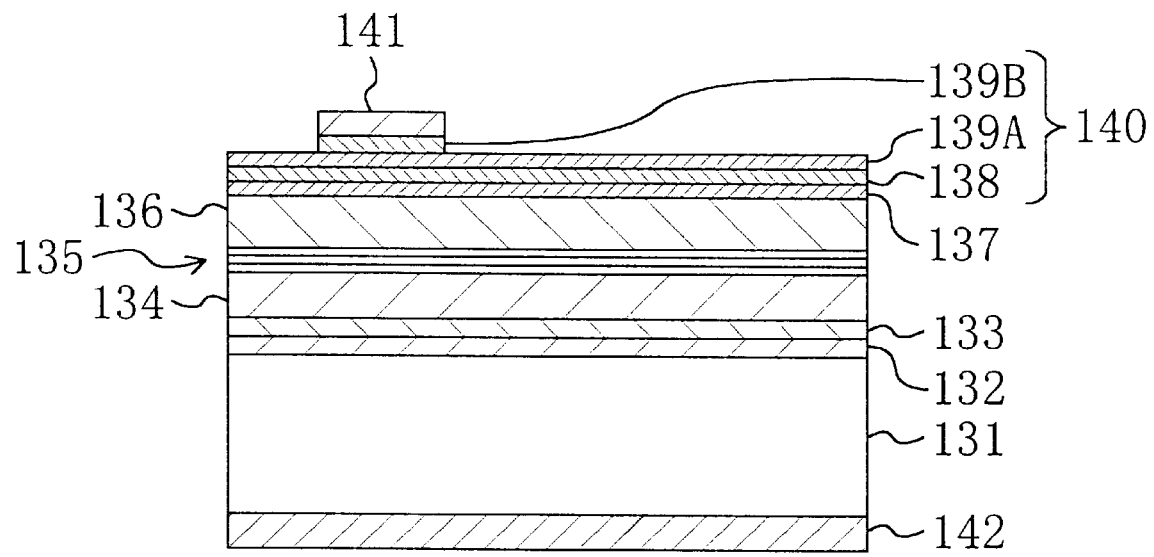
FIG. 16 is a sectional view of a light emitting diode device of the eighth embodiment.

In the above description, the vertical cavity surface emitting laser diode 110 is exemplified, but the similar effects as those exhibited by the surface emitting laser diode 110 can be attained in a light emitting diode device 130 of FIG. 16. Thus, it is possible to obtain a highly efficient device in which a current can be well spread and the light absorption loss can be reduced.

As is shown in FIG. 16, a first buffer layer 132 of n-type GaAs with a thickness of 0.5 µm, a second buffer layer 133 of n-type ZnSe or n-type $ZnS_{0.06}Se_{0.94}$ with a thickness of 10 nm, an n-type cladding layer 134 of n-type $Zn_{0.9}Mg_{0.1}S_{0.13}Se_{0.87}$ with a thickness of 600 nm, a multi-quantum well active layer 135 of a multilayer of ZnCdSe/ZnSe with a thickness of 10 nm, a p-type cladding layer 136 of p-type $Zn_{0.9}Mg_{0.1}S_{0.13}Se_{0.87}$ with a thickness of 600 nm, and a barrier relieving layer 137 of p-type $ZnS_{0.06}Se_{0.94}$ with a thickness of 300 nm are successively formed on a substrate 131 of n-type GaAs by, for example, the MBE. On the barrier relieving layer 137, a p-type contact structure 140 is formed.

The p-type contact structure 140 includes a first layer 138 serving as a first contact layer of p-type $ZnS_{0.4}Se_{0.4}Te_{0.2}$ with a thickness of 20 nm, and a second layer 139A of p-type $ZnS_{0.65}Te_{0.35}$ with a thickness of 10 nm and a third layer 139B of p-type $ZnS_{0.5}Te_{0.5}$ with a thickness of 5 nm, together serving as a second contact layer.

On the third layer 139B of the p-type contact structure 140, an island-shaped positive metal electrode 141 of Au/Pd is formed. The third layer 139B is formed into the same shape as the positive metal electrode 141. On the entire back surface of the substrate 131, a negative metal electrode 142 of AuGeNi or the like is formed.

In the light emitting diode device 130 having the aforementioned structure, a current injected from the positive metal electrode 141 is effectively spread within the p-type contact structure 140 with a small resistance in the direction parallel to the substrate surface. Accordingly, the current can be injected into the multi-quantum well active layer 135 in a wide range below the p-type contact structure 140. As a result, the device can emit light from the entire top surface thereof. At this point, since the positive metal electrode 141 is opaque, it is difficult to take out light generated directly below the positive metal electrode 141, but the light can be easily released to the top surface due to the current spread in the p-type contact structure 140 around the positive metal electrode 141.

In this case, most of the light generated in the multi-quantum well active layer 135 permeates the p-type contact structure 140 to be externally released, and hence, the emission efficiency can be degraded when the light absorption is caused in the p-type contact structure 140.

However, as described above, the light absorption is very small in the p-type contact structure 140 of this embodiment as compared with that in the conventional contact structure. Accordingly, the resultant light emitting diode device 130 can attain high efficiency.

In the aforementioned semiconductor devices of this invention, ZnS is used in the insulating layer for burying the mesa part, but ZnS can be replaced with ZnO, $SiO_2$, $Al_2O_3$ or an undoped group II-VI compound semiconductor.

Furthermore, in each of the aforementioned semiconductor laser diodes of this invention, the GaAs substrate is used, but a ZnSe substrate having substantially the same lattice constant as GaAs can be used. Alternatively, since the lattice constant and the valence band level can be varied in a wide range according to the invention, when a substrate of, for example, GaP or InP is used, the same effects can be achieved by selecting an appropriate composition for attaining the lattice match with the substrate.

As the semiconductor laser diode of this invention, a single quantum well type semiconductor laser diode is exemplified in the above description, but the structure of the semiconductor laser diode of this invention is not limited to this type. The invention is applicable to a multi-quantum well type or buried type semiconductor laser diode.

Also, the semiconductor laser diode is exemplified as the semiconductor light emitting device in the above description, which does not limit the invention, but the invention is applicable to a light emitting device or a light detecting device using a group II-VI compound semiconductor.

Furthermore, in the aforementioned embodiments, the metal electrode of Au/Pd is used as the positive metal electrode. However, in the p-type contact structure of this invention, the valence band level can be changed up to a sufficiently high level and a high acceptor density can be realized, and hence, a metal of Pt, Ti or Ni can be used as the material for the electrode. Moreover, when a different metal, for example, Au, Pt, Ti and Cr, is stacked on any of these metal materials, the mechanical strength, and the reliability and the weather resistance of bonding can be improved.

In addition, the device of a group II-VI compound semiconductor grown on the GaAs substrate is exemplified as the semiconductor device of this invention in each of the aforementioned embodiments, but the invention is applicable to a device including a group II-VI compound semiconductor merely in a part thereof. For example, the invention is applicable to a device in which a p-type group II-VI compound semiconductor is included merely in a gate area of a field effect transistor and Si or a group III-V compound semiconductor is included in other areas, or a device in which a p-type II-VI compound semiconductor is included in a cladding area of a waveguide device and a group III-V compound semiconductor is included in other areas.

What is claimed is:

1. A semiconductor device comprising:

a semiconductor layer of a p-type group II-VI compound semiconductor formed on a substrate;

a first contact layer of $ZnS_wSe_{1-w-x}Te_x$, wherein $0<w<1$, $0<x<1$ and $w+x<1$, formed on said semiconductor layer;

a second contact layer of $ZnS_{1-y}Te_y$, wherein $0<y \leq 1$, formed on said first contact layer; and an electrode of a metal formed on said second contact layer.

2. The semiconductor device of claim 1,
wherein said substrate is made from GaAs or ZnSe, and
said first contact layer has a composition matching in a lattice size with GaAs or ZnSe in at least a portion thereof closer to said semiconductor layer.

3. The semiconductor device of claim 2,
wherein said first contact layer is made from $ZnS_wSe_{1-w-x}Te_x$, wherein $0.2<w\leq0.65$ and $0.05<x\leq0.35$.

4. The semiconductor device of claim 3,
wherein said first contact layer includes a layer of $ZnS_wSe_{1-w-x}Te_x$, wherein $0.3<w\leq0.4$ and $0.1<x\leq0.2$, in a portion thereof closer to said semiconductor layer and a layer of $ZnS_wSe_{1-w-x}Te_x$, wherein $0.4<w\leq0.5$ and $0.2<x\leq0.3$, in another portion thereof closer to said electrode.

5. The semiconductor device of claim 1,
wherein composition ratios of S and Te in said first contact layer are increased in a direction from said semiconductor layer toward said electrode.

6. The semiconductor device of claim 5,
wherein said first contact layer includes plural layers having different compositions.

7. The semiconductor device of claim 5,
wherein said first contact layer includes, in at least a portion thereof, a layer whose composition is continuously changed.

8. The semiconductor device of claim 1,
wherein said substrate is made from GaAs or ZnSe, and said second contact layer is made from $ZnS_{1-y}Te_y$, wherein $0.3<y\leq1$.

9. The semiconductor device of claim 8,
wherein said second contact layer includes a layer of $ZnS_{1-y}Te_y$, wherein $0.3<y<0.4$, in a portion thereof closer to said first contact layer.

10. The semiconductor device of claim 1,
wherein said second contact layer includes a layer of ZnTe in a portion thereof closer to said electrode.

11. The semiconductor device of claim 1,
wherein a composition ratio of Te in said second contact layer is gradually increased in a direction from said first contact layer toward said electrode.

12. The semiconductor device of claim 1,
wherein said semiconductor layer is made from ZnMgSSe, and
said semiconductor device further includes a barrier relieving layer of ZnSe or ZnSSe between said semiconductor layer and said first contact layer.

13. A semiconductor light emitting device comprising:
a first semiconductor layer of a group II-VI compound of a first conductivity type formed on a substrate;
an active layer formed on said first semiconductor layer;
a second semiconductor layer of a group II-VI compound of a second conductivity type formed on said active layer; and
an electrode of a metal formed on said second semiconductor layer,
wherein a first contact layer of $ZnS_wSe_{1-w-x}Te_x$, wherein $0<w\leq1$, $0<x<1$ and $w+x<1$, and a second contact layer of $ZnS_{1-y}Te_y$, wherein $0<y\leq1$, successively formed on said second semiconductor layer are sandwiched between said second semiconductor layer and said electrode.

14. The semiconductor light emitting device of claim 13,
wherein said semiconductor light emitting device is a light emitting diode in which the first conductivity type is an n-type and the second conductivity type is a p-type.

15. The semiconductor light emitting device of claim 13,
wherein said semiconductor light emitting device is a vertical cavity surface laser diode in which the first conductivity type is an n-type and the second conductivity type is a p-type.

* * * * *